United States Patent
Whetsel et al.

(10) Patent No.: US 9,562,946 B2
(45) Date of Patent: Feb. 7, 2017

(54) INTEGRATED CIRCUIT WAFER HAVING PLURAL DIES WITH EACH DIE INCLUDING TEST CIRCUIT RECEIVING EXPECTED DATA AND MASK DATA FROM DIFFERENT PADS

(71) Applicant: TEXAS INSTRUMENTS INCORPORATED, Dallas, TX (US)

(72) Inventors: Lee D. Whetsel, Parker, TX (US); Alan Hales, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/078,039

(22) Filed: Mar. 23, 2016

(65) Prior Publication Data

US 2016/0202319 A1    Jul. 14, 2016

Related U.S. Application Data

(62) Division of application No. 14/792,384, filed on Jul. 6, 2015, now Pat. No. 9,322,879, which is a division of
(Continued)

(51) Int. Cl.
*G01R 31/3185* (2006.01)
*G01R 31/3177* (2006.01)
(Continued)

(52) U.S. Cl.
CPC ....... *G01R 31/3177* (2013.01); *G01R 1/07342* (2013.01); *G01R 31/31924* (2013.01);
(Continued)

(58) Field of Classification Search
CPC ............ H01L 22/34; G01R 31/318536; G01R 31/318544; G01R 31/318563; G01R 31/318566; G01R 31/318572
See application file for complete search history.

(56) References Cited

U.S. PATENT DOCUMENTS

| 6,483,758 B1 | 11/2002 | Kim et al. |
| 6,591,211 B1 | 7/2003 | Schnarch |
| 6,717,429 B2 | 4/2004 | Whetsel |

FOREIGN PATENT DOCUMENTS

JP    2000090692 A    3/2000

*Primary Examiner* — Stephen W Smoot
(74) *Attorney, Agent, or Firm* — Lawrence J. Bassuk; Charles A. Brill; Frank D. Cimino

(57) ABSTRACT

Test circuits located on semiconductor die enable a tester to test a plurality of die/ICs in parallel by inputting both stimulus and response patterns to the plurality of die/ICs. The response patterns from the tester are input to the test circuits along with the output response of the die/IC to be compared. Also disclosed is the use of a response signal encoding scheme whereby the tester transmits response test commands to the test circuits, using a single signal per test circuit, to perform: (1) a compare die/IC output against an expected logic high, (2) a compare die/IC output against an expected logic low, and (3) a mask compare operation. The use of the signal encoding scheme allows functional testing of die and ICs since all response test commands (i.e. 1-3 above) required at each die/IC output can be transmitted to each die/IC output using only a single tester signal connection per die/IC output. In addition to functional testing, scan testing of die and ICs is also possible.

3 Claims, 27 Drawing Sheets

Related U.S. Application Data application No. 14/494,092, filed on Sep. 23, 2014, now Pat. No. 9,103,885, which is a division of application No. 14/187,691, filed on Feb. 24, 2014, now Pat. No. 8,872,178, which is a division of application No. 14/068,819, filed on Oct. 31, 2013, now Pat. No. 8,692,248, which is a division of application No. 13/629,854, filed on Sep. 28, 2012, now Pat. No. 8,604,475, which is a division of application No. 12/911,424, filed on Oct. 25, 2010, now Pat. No. 8,299,464, which is a division of application No. 12/638,441, filed on Dec. 15, 2009, now Pat. No. 7,842,949, which is a division of application No. 12/329,957, filed on Dec. 8, 2008, now Pat. No. 7,655,946, which is a division of application No. 11/971,561, filed on Jan. 9, 2008, now Pat. No. 7,491,970, which is a division of application No. 11/626,201, filed on Jan. 23, 2007, now abandoned, which is a division of application No. 11/103,781, filed on Apr. 11, 2005, now Pat. No. 7,183,570, which is a division of application No. 10/301,898, filed on Nov. 22, 2002, now Pat. No. 6,894,308.

(60) Provisional application No. 60/333,803, filed on Nov. 28, 2001.

(51) Int. Cl.
*G01R 31/319* (2006.01)
*G01R 1/073* (2006.01)

(52) U.S. Cl.
CPC ............... *G01R 31/318536* (2013.01); *G01R 31/318541* (2013.01); *G01R 31/318544* (2013.01); *G01R 31/318547* (2013.01); *G01R 31/318555* (2013.01); *G01R 31/318558* (2013.01); *G01R 31/318563* (2013.01); *G01R 31/318566* (2013.01); *G01R 31/318572* (2013.01); *G01R 31/31926* (2013.01)

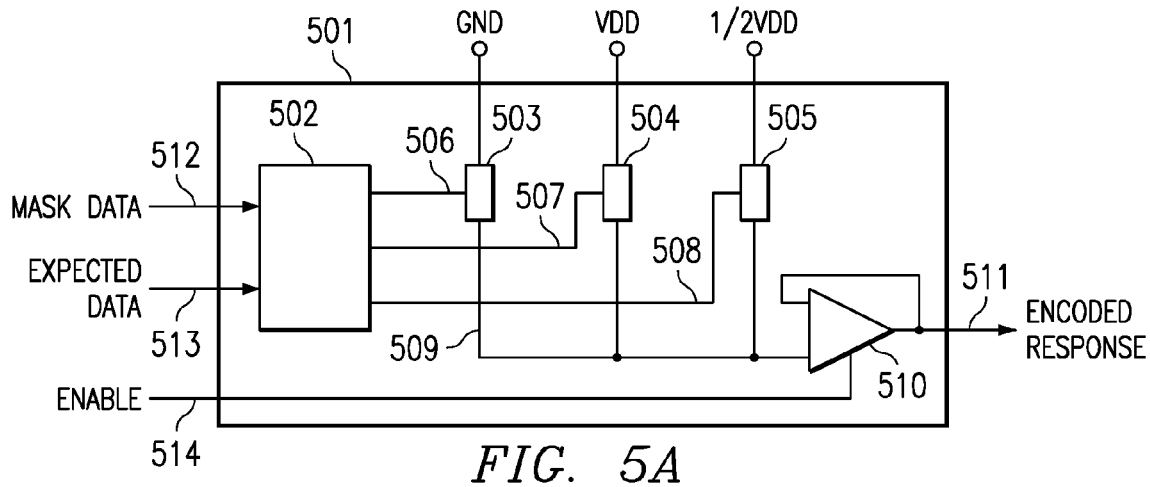
FIG. 5A
| ENA | MSK | EXP | ENR | OUTPUT MODE |
|---|---|---|---|---|
| 0 | 0 | 0 | Z | DISABLED |
| 1 | 0 | 0 | GND | LOW |
| 1 | 0 | 1 | VDD | HIGH |
| 1 | 1 | X | 1/2VDD | MASK |
FIG. 5B
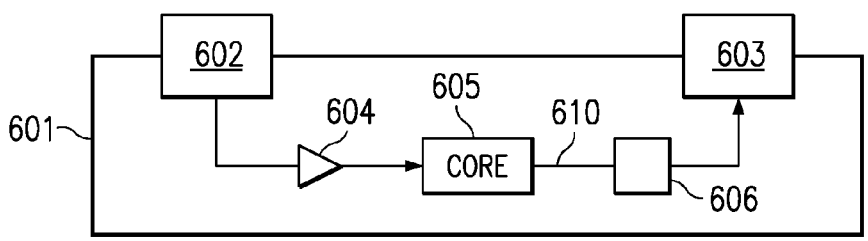
FIG. 6A

*FIG. 7B*
| TEN | ENR | MSK | EXP | FUNCTION PERFORMED |
|---|---|---|---|---|
| 0 | X | X | X | TEST DISABLED |
| 1 | GND | 1 | 0 | COMPARE LOW |
| 1 | VDD | 1 | 1 | COMPARE HIGH |
| 1 | 1/2VDD | 0 | X | MASK COMPARE |
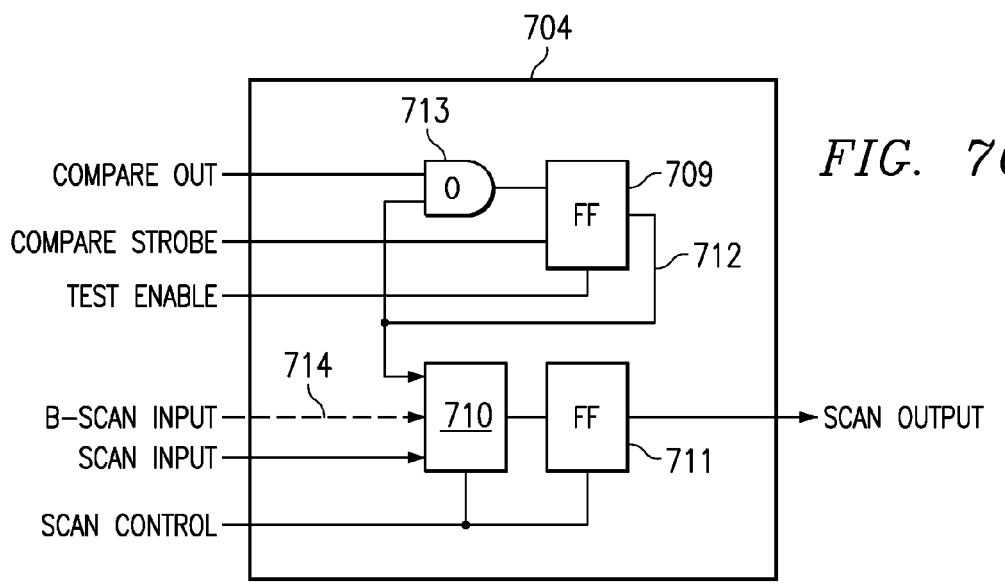
*FIG. 7C*
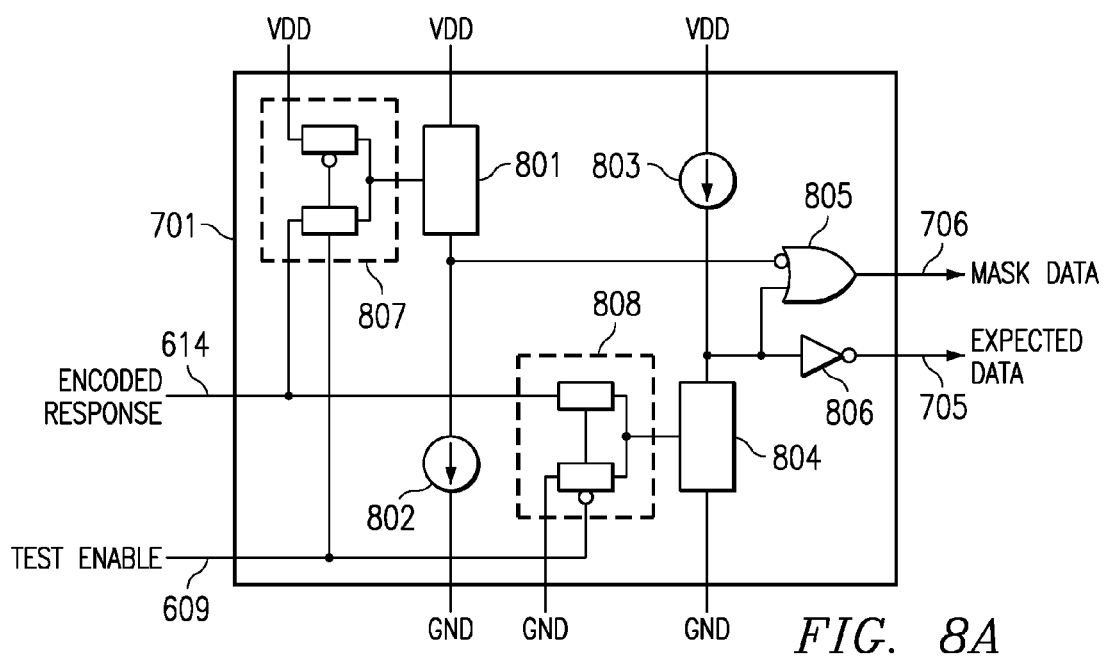
*FIG. 8A*

FIG. 8B
| TEN | ENR | MSK | EXP | FUNCTION PERFORMED |
|-----|-------|-----|-----|--------------------|
| 0 | X | 1 | 0 | GATE DISABLED |
| 1 | GND | 1 | 0 | OUTPUT A LOW |
| 1 | VDD | 1 | 1 | OUTPUT A HIGH |
| 1 | 1/2VDD | 0 | X | OUTPUT A MASK |
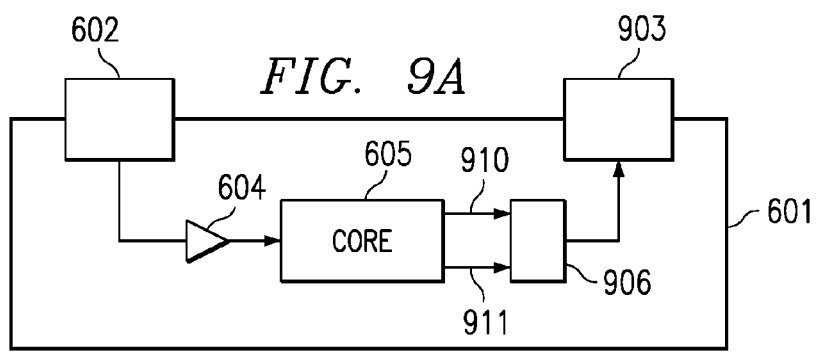
FIG. 9A
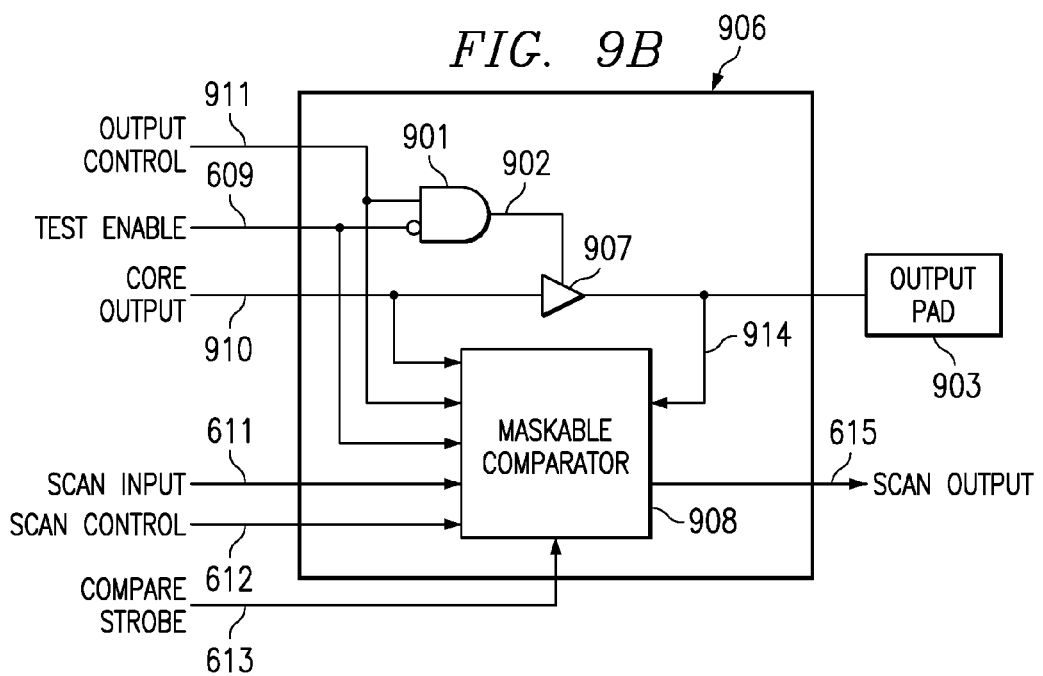
FIG. 9B

| OC | TEN | ENR | MSK | EXP | FUNCTION PERFORMED |
|---|---|---|---|---|---|
| X | 0 | X | X | X | TEST DISABLED |
| 1 | 1 | GND | 1 | 0 | COMPARE LOW |
| 1 | 1 | VDD | 1 | 1 | COMPARE HIGH |
| 1 | 1 | 1/2VDD | 0 | X | MASK COMPARE |
| 0 | 1 | GND/VDD | 1 | 0/1 | TEST OUTPUT CONTROL |

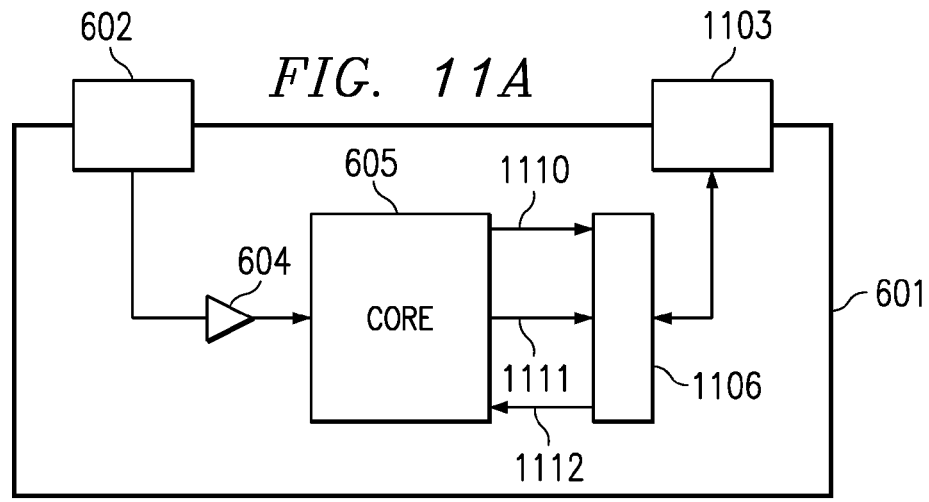
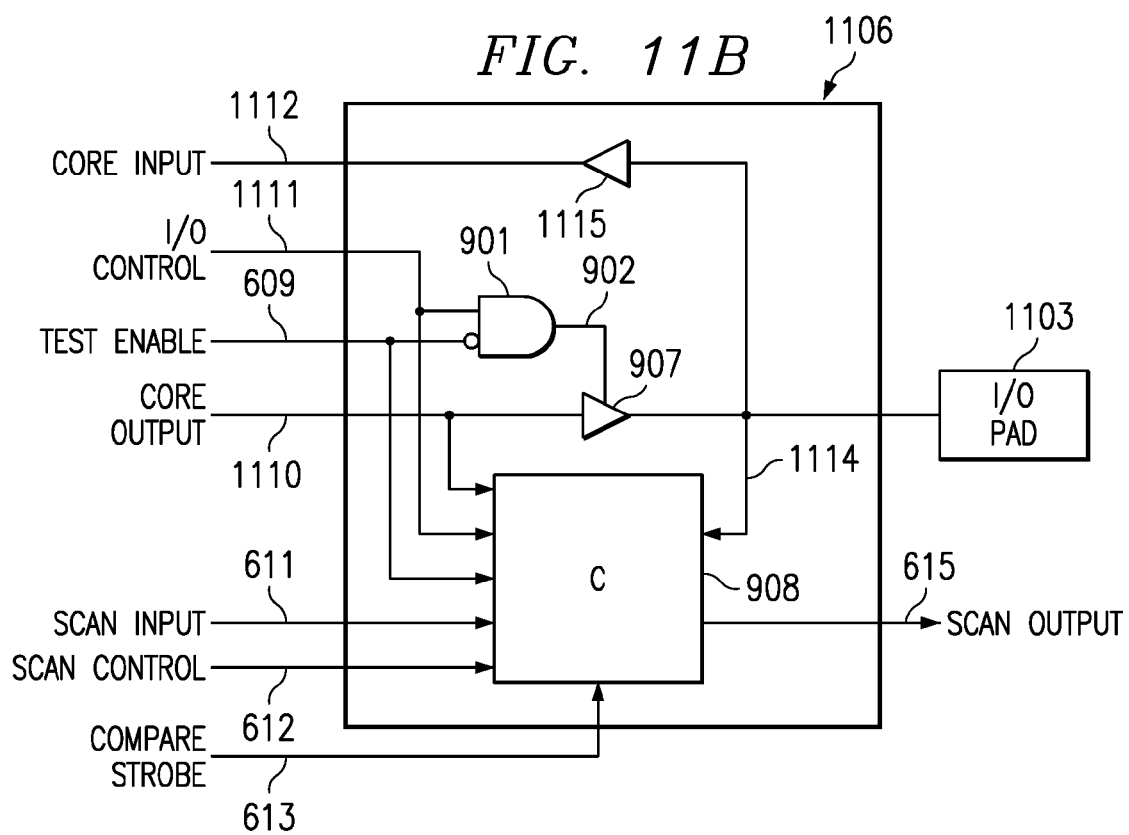

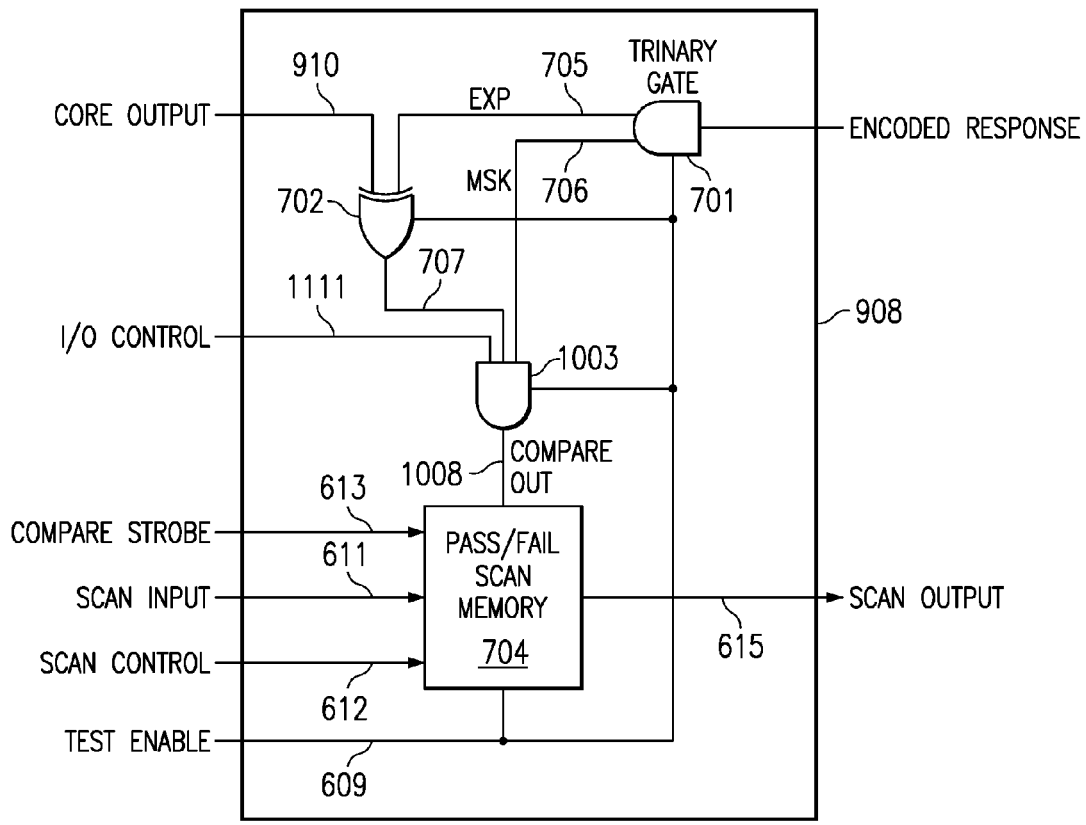

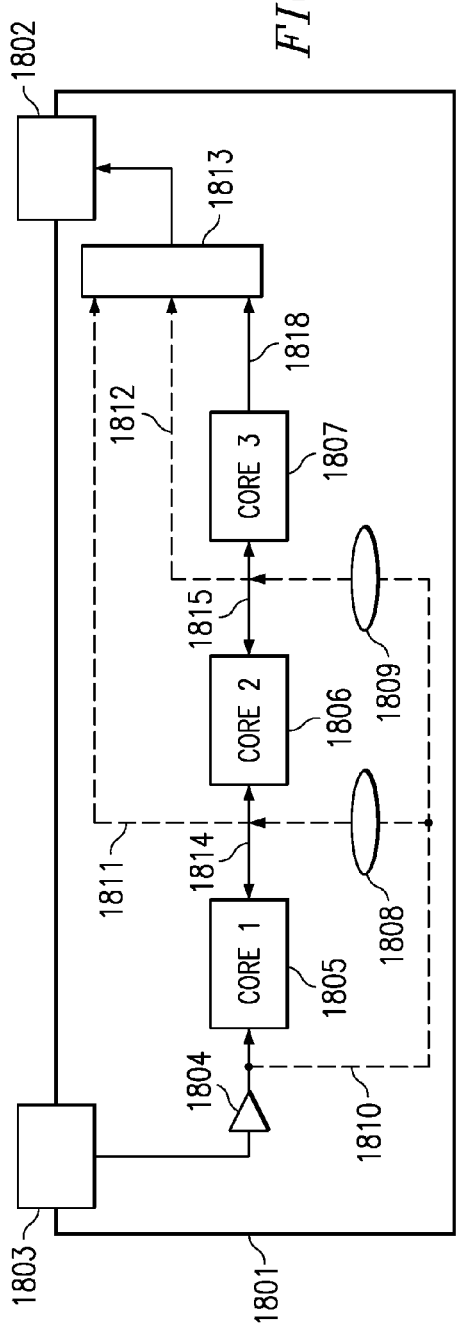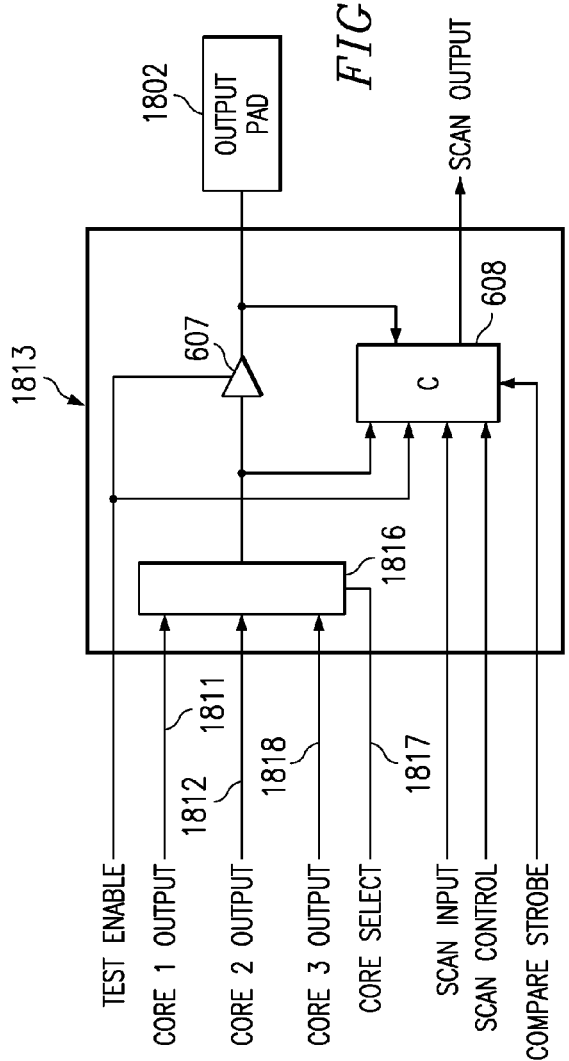

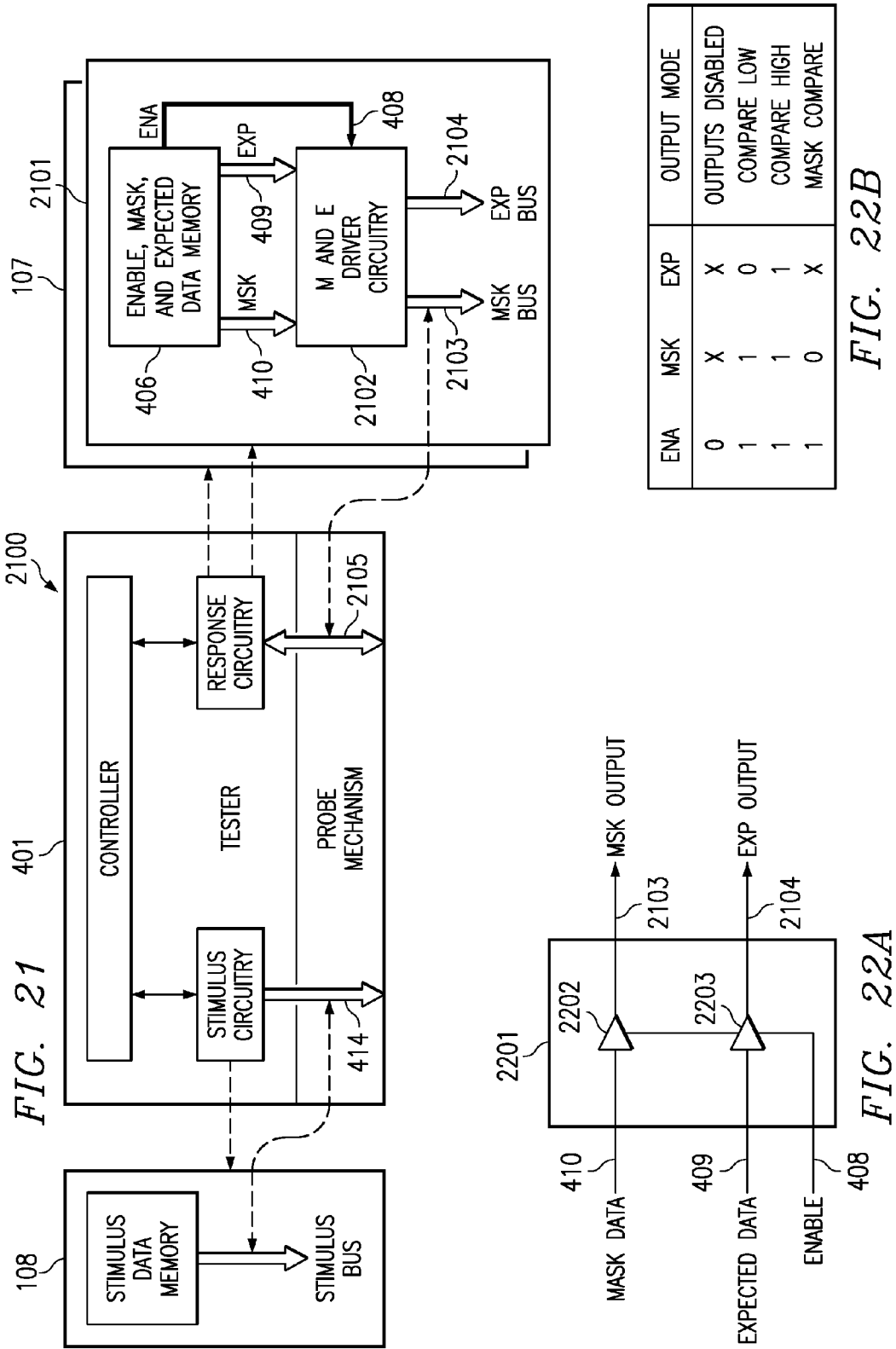

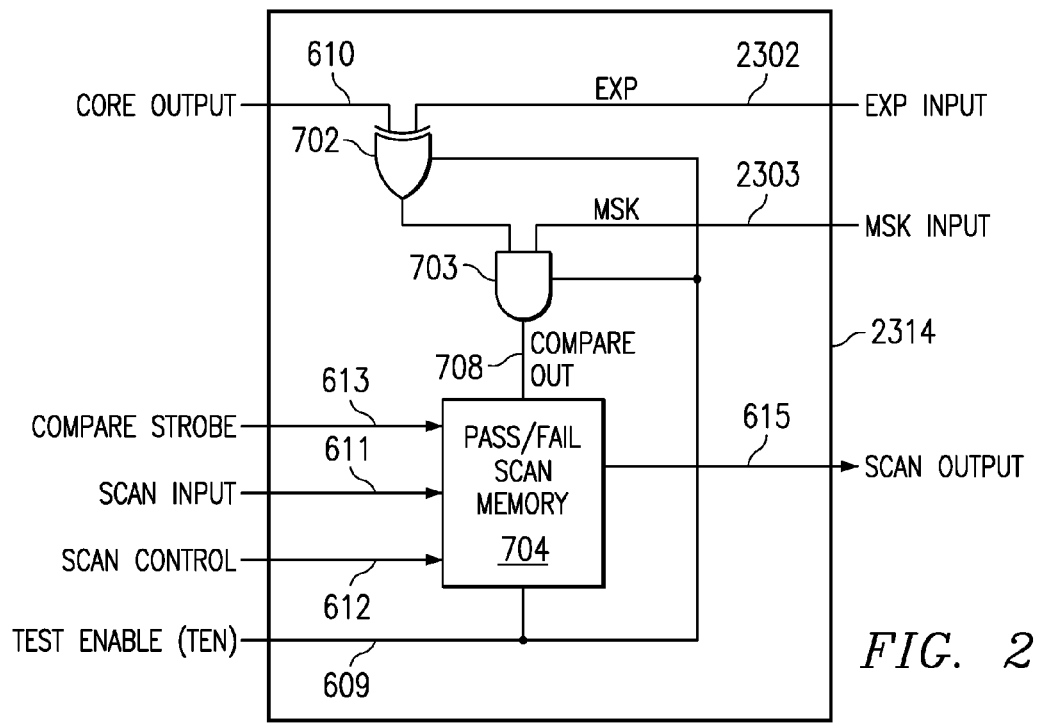
*FIG. 26A*
| TEN | MSK | EXP | FUNCTION PERFORMED |
|---|---|---|---|
| 0 | X | X | TEST DISABLED |
| 1 | 1 | 0 | COMPARE LOW |
| 1 | 1 | 1 | COMPARE HIGH |
| 1 | 0 | X | MASK COMPARE |
*FIG. 26B*
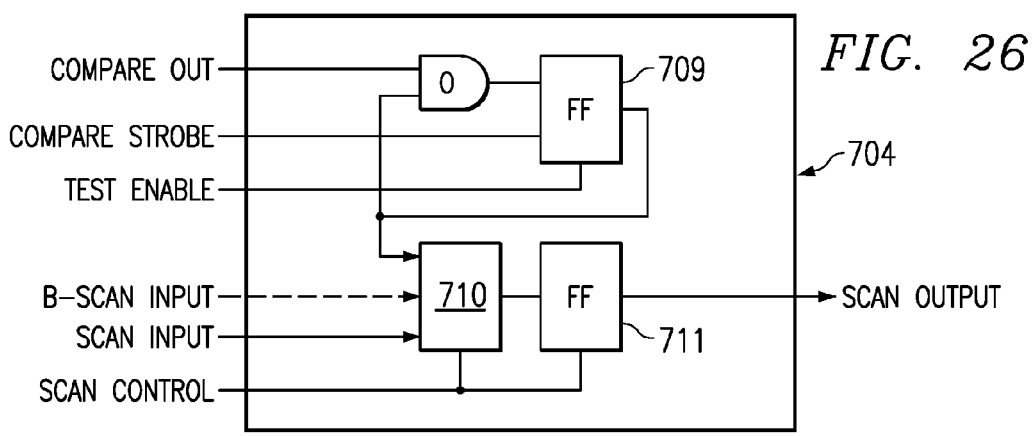
*FIG. 26C*

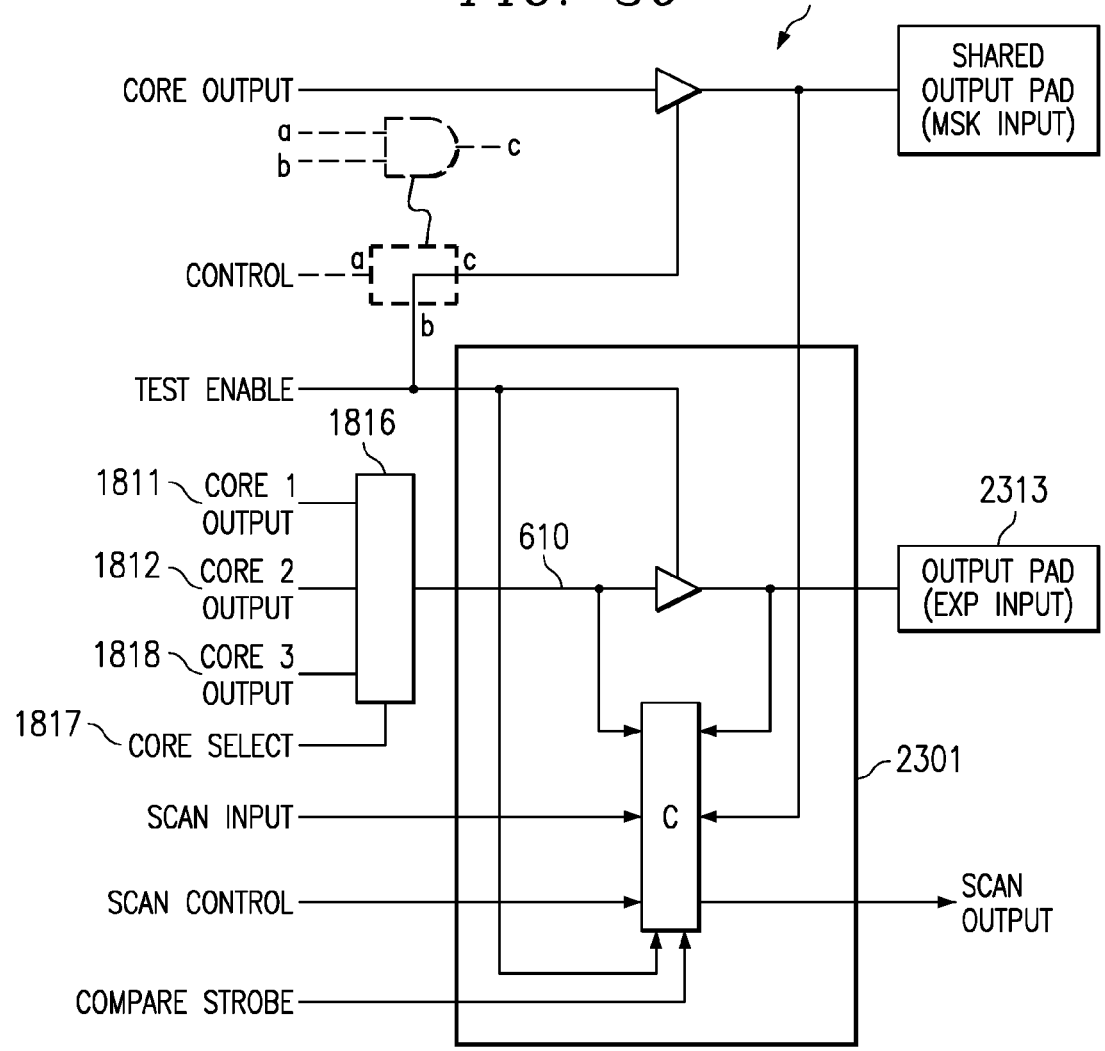

INTEGRATED CIRCUIT WAFER HAVING PLURAL DIES WITH EACH DIE INCLUDING TEST CIRCUIT RECEIVING EXPECTED DATA AND MASK DATA FROM DIFFERENT PADS

CROSS-REFERENCE TO RELATED APPLICATIONS

This application is a divisional of application Ser. No. 14/792,384, filed Jul. 6, 2015, now U.S. Pat. No. 9,322,879, issued Apr. 26, 2016;

Which was a divisional of application Ser. No. 14/494,092, filed Sep. 23, 2014, now U.S. Pat. No. 9,103,885, issued Aug. 11, 2015;

Which was a divisional of application Ser. No. 14/187,691, filed Feb. 24, 2014, now U.S. Pat. No. 8,872,178, issued Oct. 28, 2014;

Which was a divisional of application Ser. No. 14/068,819, filed Oct. 31, 2013, now U.S. Pat. No. 8,692,248, issued Apr. 8, 2014;

Which was a divisional of application Ser. No. 13/629,854, filed Sep. 28, 2012, now U.S. Pat. No. 8,604,475, issued Dec. 10, 2013;

Which was a divisional of application Ser. No. 12/911,424, filed Oct. 25, 2010, now U.S. Pat. No. 8,299,464, issued Oct. 30, 2012;

Which was a divisional of application Ser. No. 12/638,441, filed Dec. 15, 2009, now U.S. Pat. No. 7,842,949, issued Nov. 30, 2010;

Which was a divisional of application Ser. No. 12/329,957, filed Dec. 8, 2008, now U.S. Pat. No. 7,655,946, issued Feb. 2, 2010;

Which was a divisional of application Ser. No. 11/971,561, filed Jan. 9, 2008, now U.S. Pat. No. 7,491,970, issued Feb. 17, 2009;

Which was a continuation of application Ser. No. 11/626,201, filed Jan. 23, 2007, now abandoned;

which was a divisional of application Ser. No. 11/103,781, filed Apr. 11, 2005, now U.S. Pat. No. 7,183,570, issued Feb. 27, 2007;

which was a divisional of application Ser. No. 10/301,898, filed Nov. 22, 2002, now U.S. Pat. No. 6,894,308, issued May 17, 2005;

which claims priority under 35 USC 119(e)(1) of provisional application Ser. No. 60/333,803, filed Nov. 28, 2001.

FIELD OF THE DISCLOSURE

As the geometry of semiconductor transistors continue to shrink, more and more functional circuitry may be embedded within integrated circuits (ICs). This trend is beneficial for the electronics industry since it enables development of smaller, lower power electronic consumer products, such as cell phones and hand held computers. However, as IC circuit density increases, the testing of ICs becomes more complex and costly for the IC manufacturers. Reducing the cost of manufacturing ICs is a primary goal for every IC manufacturer. By reducing IC manufacturing cost, an IC manufacturer can advantageously cost-differentiate its IC products from other IC manufacturers. Therefore, an IC manufacturer that continually strives to create new methods and processes for improving and reducing the cost of IC testing will, in the long run, be successful over IC manufacturers that maintain use of conventional IC testing methods and processes. The present disclosure describes a novel method and apparatus that improves upon conventional IC test methods and processes in use today.

DESCRIPTION OF THE RELATED ART

FIG. 1A illustrates a semiconductor wafer 101 comprising multiple die 102 circuits. FIG. 1B illustrates one of the die circuits 101 on wafer 101. The die contains core circuitry 103 that provides the functionality of the die, and pad locations 104 for providing contacts for accessing the core circuitry.

FIG. 1c illustrates a test arrangement for contacting and testing a single die 102 of wafer 101. The test arrangement includes a tester 105, a single die probe mechanism 109, and a die 102 to be tested. Tester 105 comprises a controller 105, stimulus circuitry 108, and response circuitry 107. Controller 106 regulates the stimulus circuitry 108 via interface 117 to output test stimulus signals to die 102 via stimulus bus 111. Controller 106 regulates the response circuitry 107 via interface 118 to receive test response signals from die 102 via response bus 110.

Probe mechanism 109 comprises the stimulus bus 111 and response bus 110 connection channels between tester 105 and die 102. The probe mechanism contacts the input 115 and output 116 die pads via small probe needles 112. While only a pair of input and output probe needles 112 are shown in this simple illustration, it is understood that all die input and output pads will be similarly contacted by the probe mechanism 109 using additional probe needles 112. The input pads 115 transfer stimulus signals to core 103 via input buffers 113, and the output pads 116 transfer test response signals from core 103 via output buffers 114. The testing of the die 102 in FIG. 1C occurs through the process of inputting stimulus signals to the die and receiving response signals from the die.

FIG. 2 illustrates in more detail the stimulus 108 and response 107 circuitry of tester 105. Stimulus circuitry 108 typically comprises a large stimulus data memory 201 for storing the stimulus data to be applied to the die. Controller 106 controls the loading of the stimulus data memory 201 from a source, such as a hard disk, prior to testing, and then controls the stimulus data memory to output the loaded stimulus data to the die during test, via stimulus bus 111. Response circuitry 107 typically comprises a large mask and expected data memory 203, a comparator 204, and a fail flag memory 202. The mask and expected data memory 203 stores mask and expected data to be used by the comparator 204 to determine if the response data from the die passes or fails.

During test, the comparator 204 inputs response signals from the die via response bus 110, and mask (M) and expected (E) data signals from memory 203 via mask and expected data buses 206 and 207. If not masked, by mask signal input from memory 203, a given response signal from the die is compared against a corresponding expected data signal from memory 203. If masked, by mask signal input from memory 203, a given response signal from the die is not compared against an expected data signal from memory 203. If a non-masked response signal matches the expected signal, the compare test passes for that signal. However, if a non-masked response signal does not match the expected signal, the compare test fails for that signal and the comparator outputs a corresponding fail signal on bus 205 to fail flag memory 202. At the end of test, the controller 106 reads the fail flag memory to determine if the die test passed or failed.

Alternately, and preferably in a production test mode, the single die test may be halted immediately upon the controller receiving a compare fail indication from the fail flag memory 202, via the interface 118 between controller 106 and response circuitry 107, to reduce wafer test time. At the end of the single die test, the probe mechanism is relocated to make contact to another single die 102 of wafer 101 and the single die test is repeated. The wafer test completes after all die 102 of wafer 101 have each been contacted and tested as described above.

FIG. 3 illustrates a test arrangement for simultaneously contacting and testing multiple die 102 of wafer 101. The test arrangement includes tester 105, multiple die probe mechanism 301, and a multiple die 1-N 102 to be tested. The difference between the single and multiple die test arrangements of FIGS. 2 and 3 is in the use of the multiple die probe mechanism 301. As seen in FIG. 3, the connection between probe mechanism 301 and tester 105 is as previously described. However, the connection between probe mechanism 301 and die 1-N is different. Each stimulus bus signal from the tester uniquely probes common pad inputs on each die 1-N. For example, the stimulus 1 (S1) signal from the stimulus bus probes all common input pads 303 of all die 1-N via connection 302. While not shown, stimulus 2-N (S2-N) signals from the stimulus bus would each similarly probe all other common input pads of all die 1-N. This allows the stimulus bus signals to simultaneously input the same stimulus to all die 1-N during the test.

As seen in FIG. 3, the die response connection of probe mechanism 301 is different from the above described die stimulus connection. Whereas each common input pad 303 of die 1-N share a single stimulus signal connection 302, each common output pad 304 requires use of a dedicated response signal connection. For example, output pad 304 of die 1 uses a response signal connection 305, output pad 304 of die 2 uses a response signal connection 306, output pad 304 of die 3 uses a response signal connection 307, and output pad 304 of die N uses a response signal connection 108. All other output pads of die 1-N would similarly use a dedicated response signal connection. All dedicated response signal connections are channeled into the response bus to tester 105, as seen in FIG. 3.

During test, the tester outputs stimulus to all die 1N and receives response outputs from all die 1-N. The test time of testing multiple die in FIG. 3 is the same as testing single die in FIG. 2. The test operates in the masked/non-masked compare mode as described in FIGS. 1C and 2. When testing multiple die simultaneously, as opposed to testing a single die, a production test preferably runs to completion even though an early compare may occur on one or more of the die being tested. This is done because typically most of the die will pass the production test and aborting the multiple die production tests on a failure indication would actually increase the test time, since the test would need to be re-run later to complete the testing of the passing die.

The limitation of the multiple die test arrangement in FIG. 3 lays in the number of dedicated response inputs 305-308 the tester 105 can accept on its response bus. For example, if the tester can accept 300 response input signals and each die has 100 output pads, the multiple die test arrangement of FIG. 3 is limited to only being able to test 3 die at a time. Testing 300 die on a wafer with this 3 die per test limitation would required having to relocate the probe mechanism 301 approximately 100 times to contact and test three die at a time. The time required to relocate the probe mechanism and repeat the die test say 100 times consumes test time, which increases the cost to manufacturer the die. It is possible to widen the response bus input of the tester to say 600 inputs to allow testing 6 die at a time, but adding circuitry to the tester to increase its response bus input width is expensive and that expense would increase the cost of manufacturing die.

The present disclosure, as described in detail below, provides improvements that overcome the limitations stated above using conventional multiple die testing arrangements. Most notably, the present disclosure provides for significantly increasing the number of die that may be tested in parallel, without having to increase the width of the tester's response bus.

SUMMARY OF THE DISCLOSURE

The present disclosure improves multiple die testing by; (1) adapting testers to communicate with multiple die using a novel response signaling technique, and (2) adapting the die to be receptive to the tester's novel response signaling technique. Also, the present disclosure improves connectivity to multiple die on wafer by processing stimulus and response interconnects on the wafer to improve access to multiple die during test. In addition to its ability to improve the testing of multiple die on wafer, the present disclosure may also be used advantageously to improve the testing of multiple packaged ICs.

The present disclosure uses test circuits located on the die to enable a tester to test a plurality of die/ICs in parallel by inputting both stimulus and response patterns to the plurality of die/ICs. The response patterns from the tester are input to the test circuits along with the output response of the die/IC to be compared. The response patterns include one of expected data and mask data input on an output pad of the die/IC and the other of expected data and mask data input on another pad of the die/IC, which may be an input pad or an output pad. In addition to functional testing, scan testing of die and ICs is also possible.

If only scan testing, not functional testing, is desired on die and ICs, the present disclosure may use binary input signaling (i.e. two logical states per signal) of response data (mask and expected data) from the tester to the test circuits rather than trinary input signaling (i.e. three logical states per signal) of response data from the tester to the test circuits. The reason this is possible during scan testing of die/ICs, is that typically only a subset of the die/ICs overall functional inputs and/or outputs need to be coupled to the tester during the test.

Thus during scan testing an ample number of additional die/IC inputs and/or outputs may be available for inputting the previously described mask and expected data signals to the die/IC using separate signal paths for each, instead of encoding each into a single signal path. The following description details the use of separate mask and expected data signaling paths to achieve the testing of plural die/ICs.

BRIEF DESCRIPTION OF THE VIEW OF THE DRAWING FIGURES

FIGS. 5A and 5B are, respectively, a block diagram of mask and expected encoding circuit in the tester of FIG. 4 and a truth table of that circuit;

FIGS. 6A and 6B are, respectively, a block diagram of a semiconductor die according to the present disclosure, and a block diagram of a test circuit substituted for the conventional two state output buffer circuit on that die;

Figure 4:
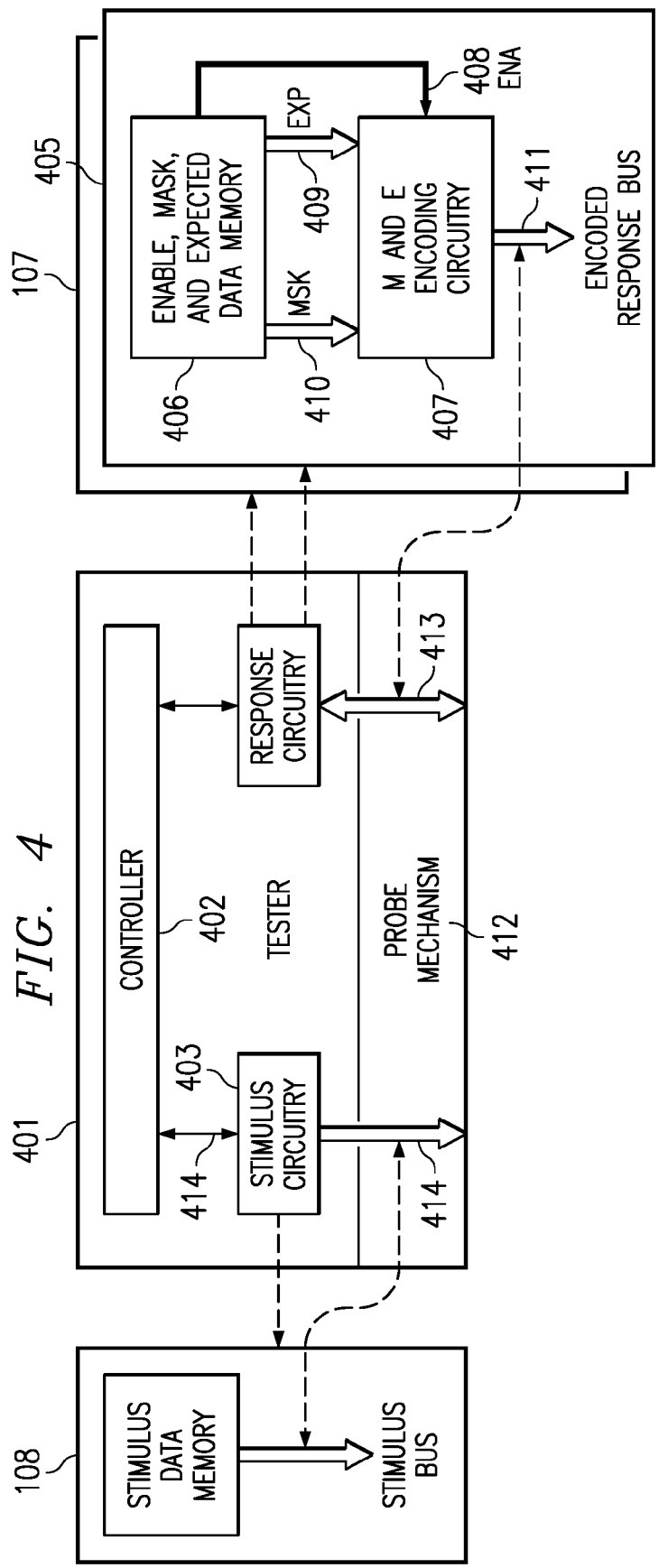
FIG. 4 is a block diagram of a semiconductor tester according to the present disclosure.
Figure 6B:
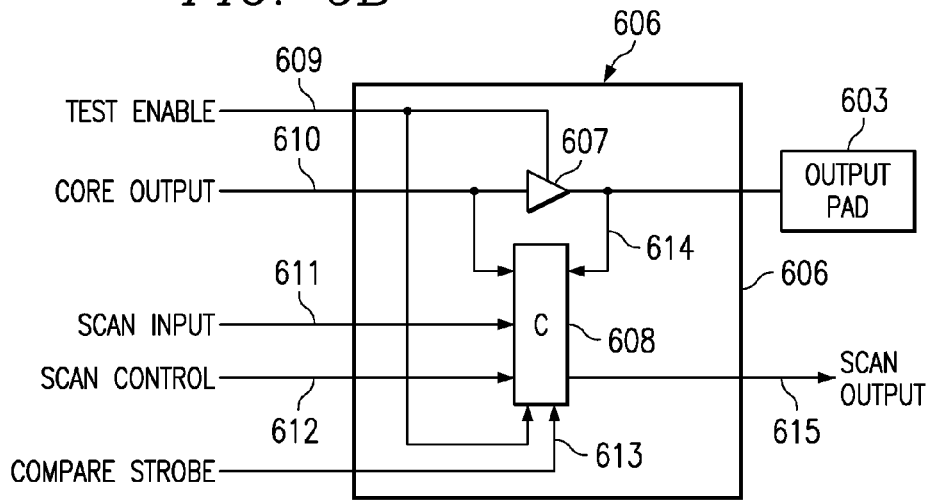
Figure 7A:
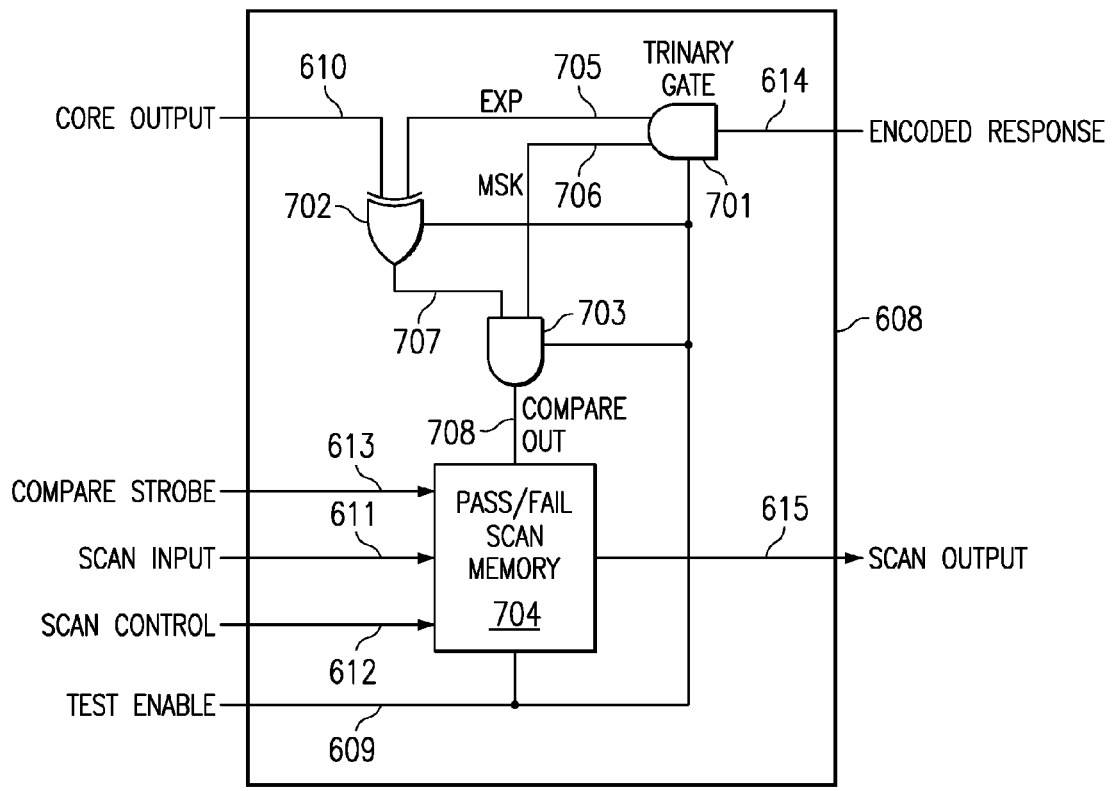
Figures 10A, 10B:
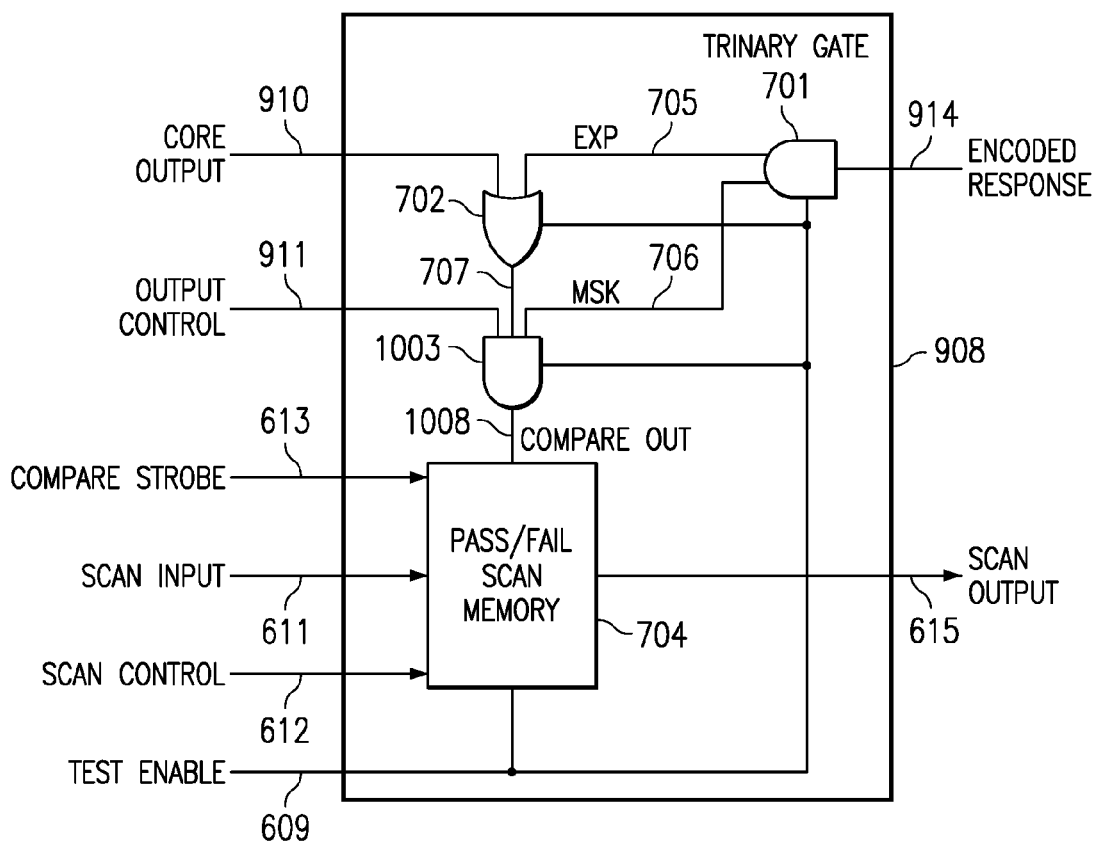
Figure 13A:
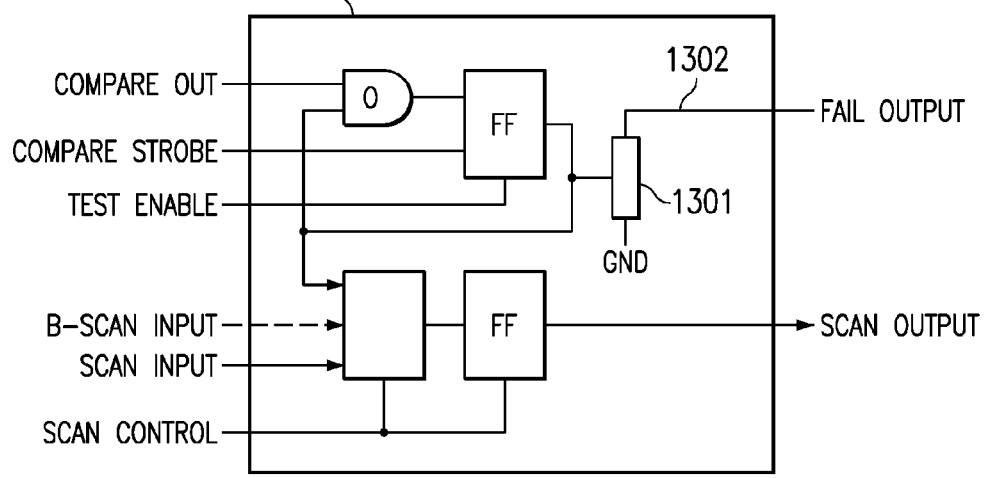
Figure 13B:
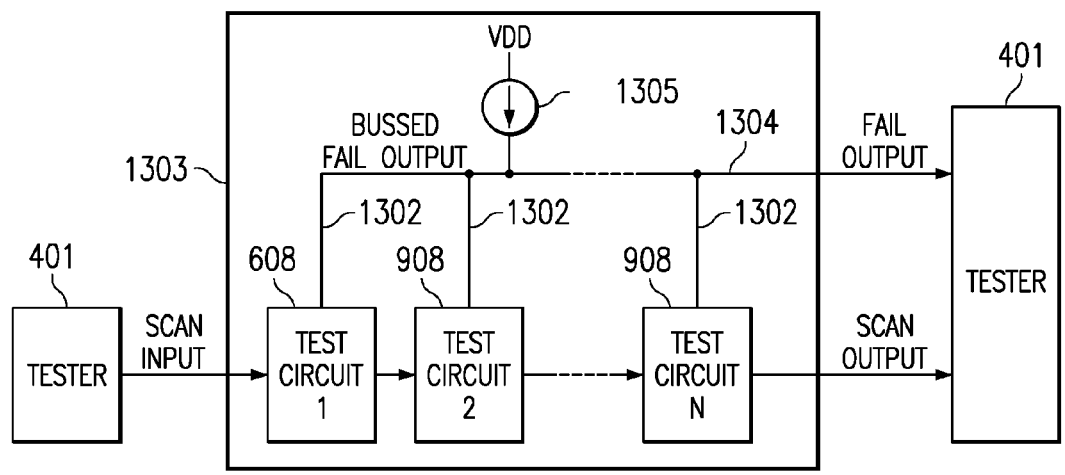
Figure 14:
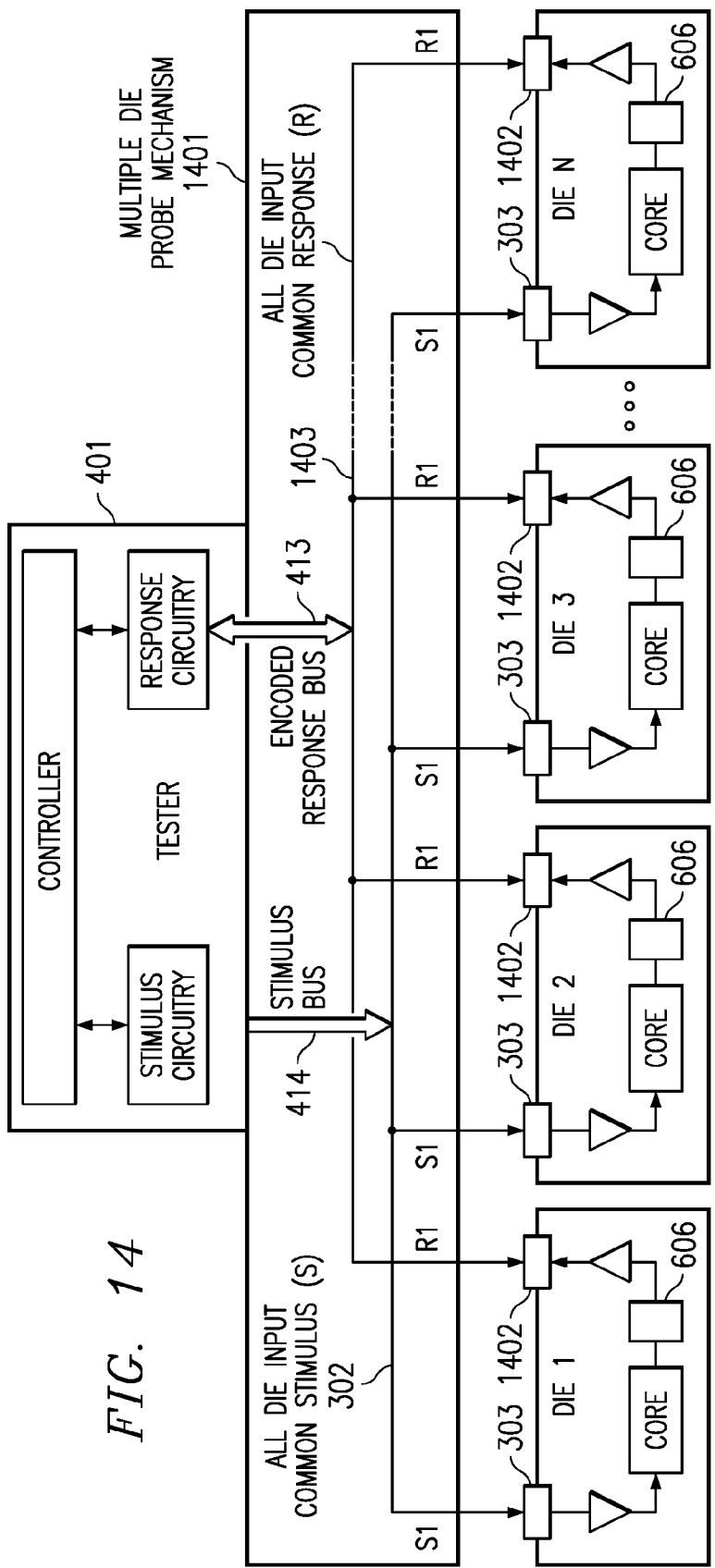
Figure 15:
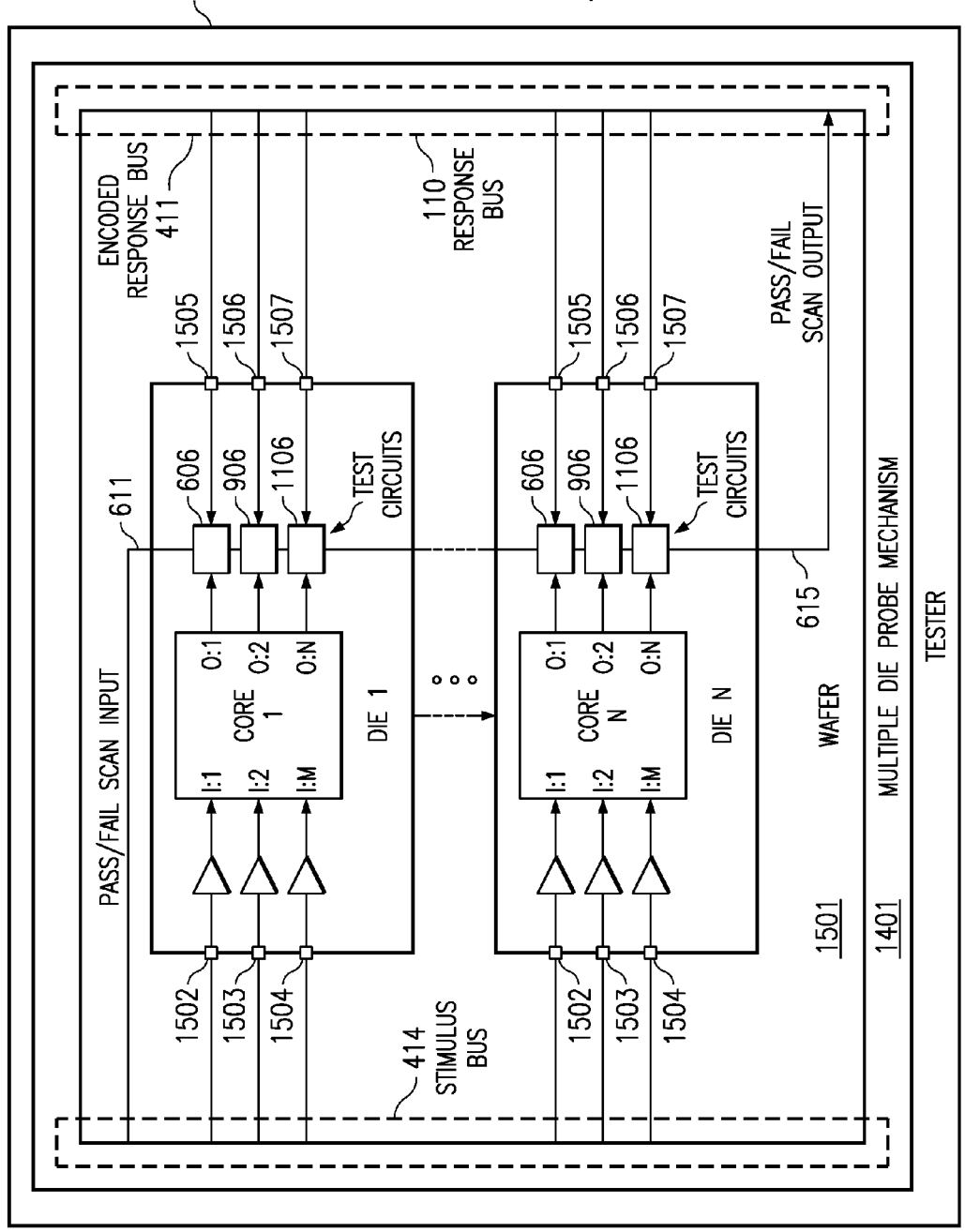
Figure 16:
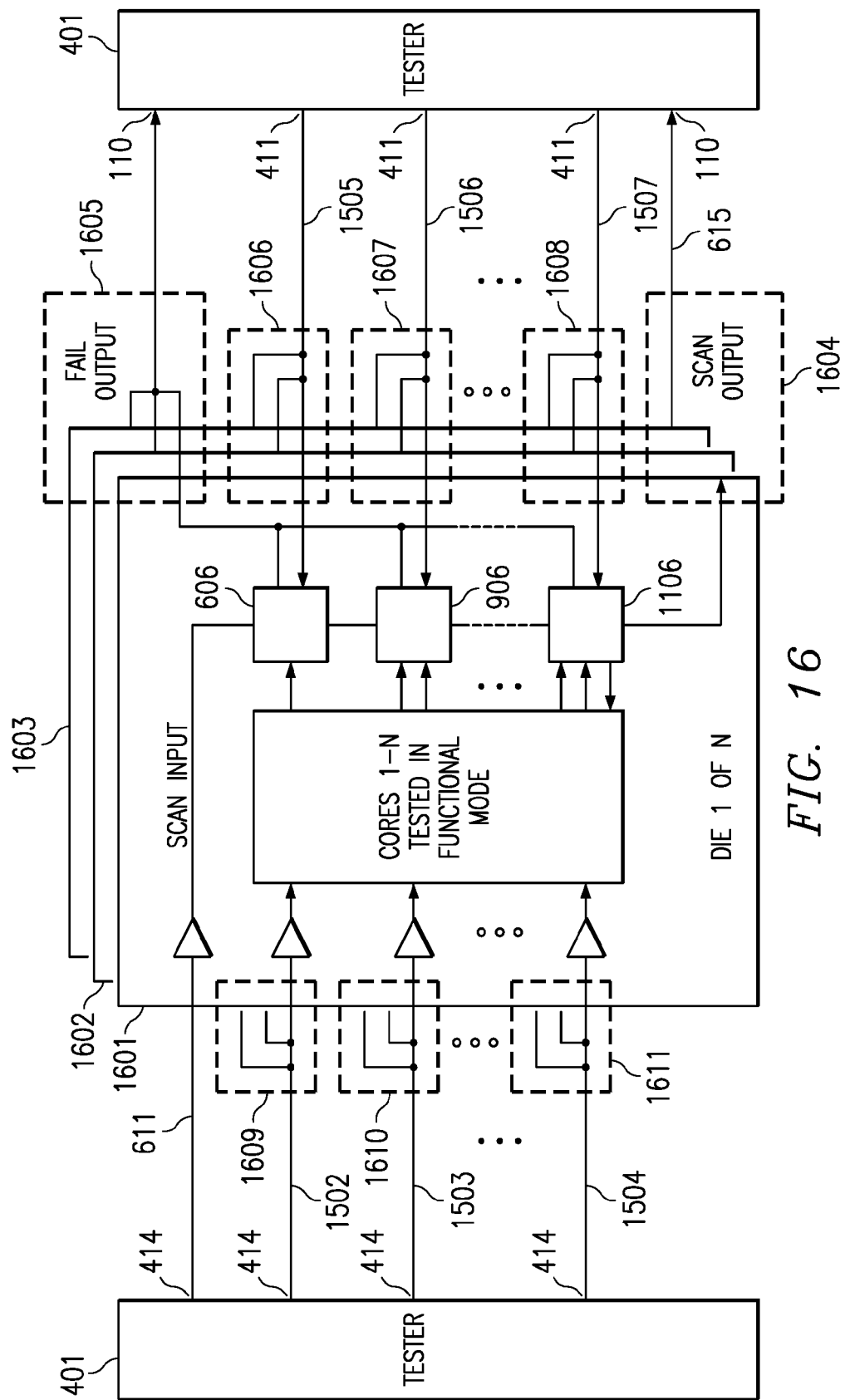
Figure 17:
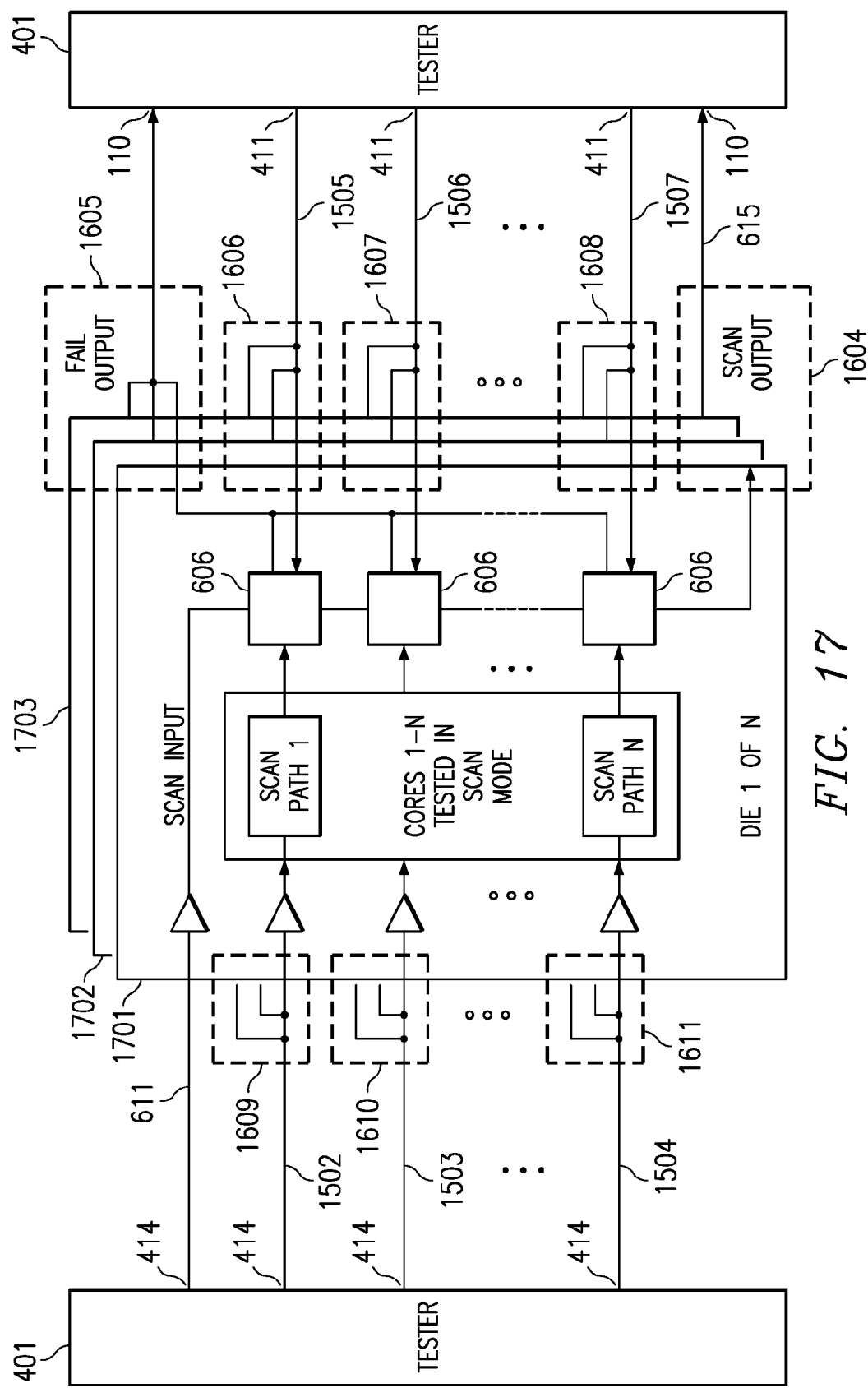
Figure 19:
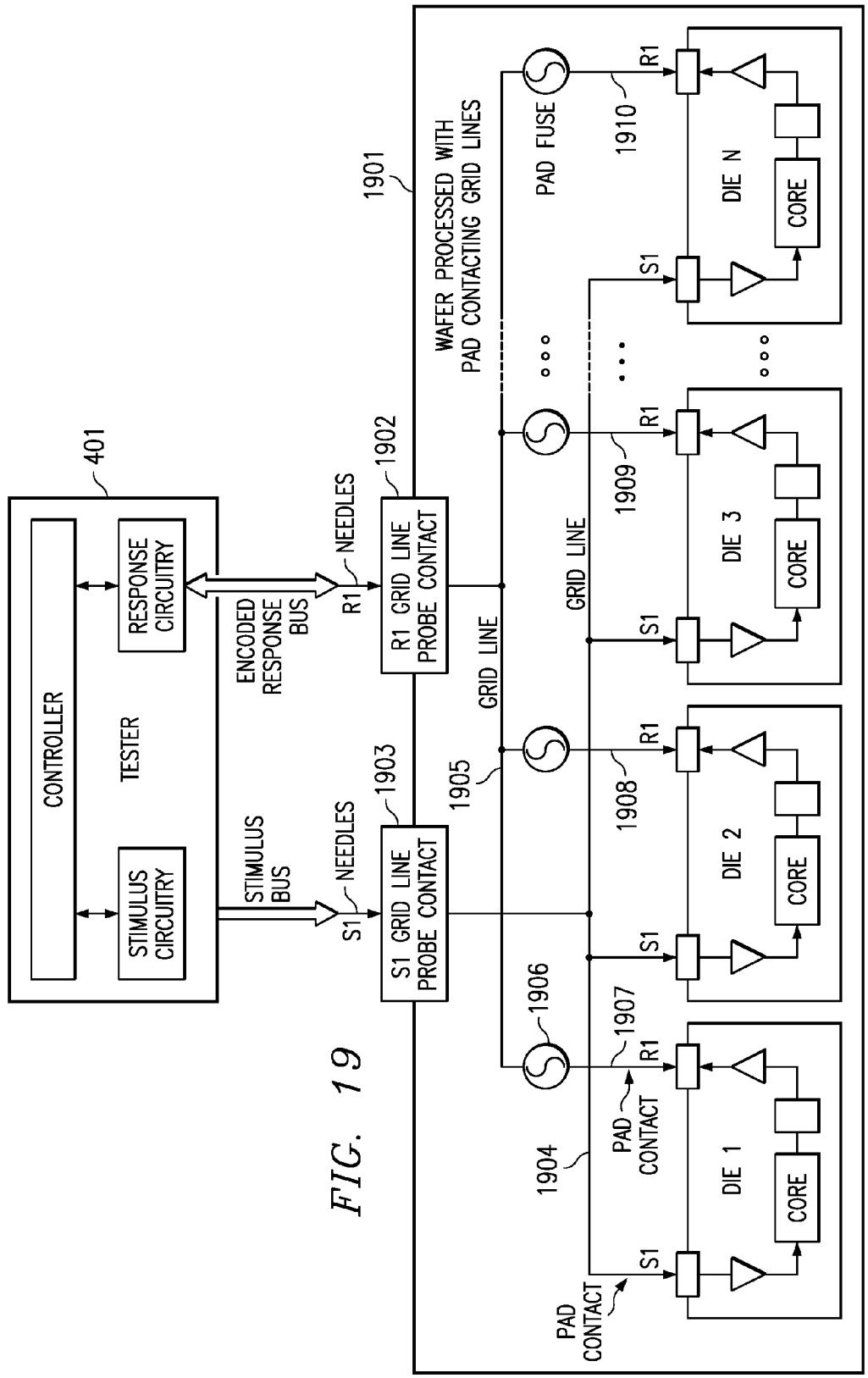
Figure 20:
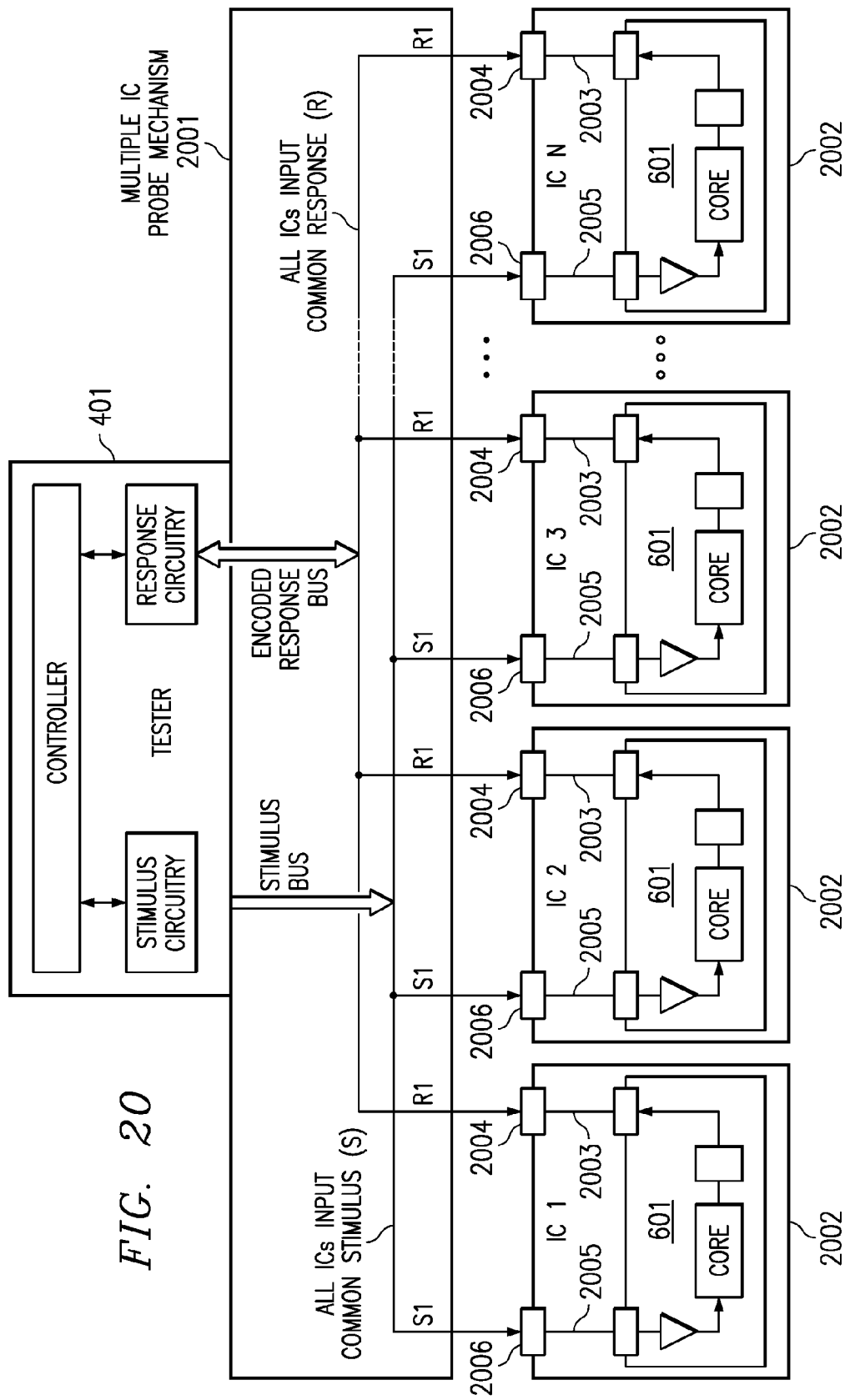
Figure 23:
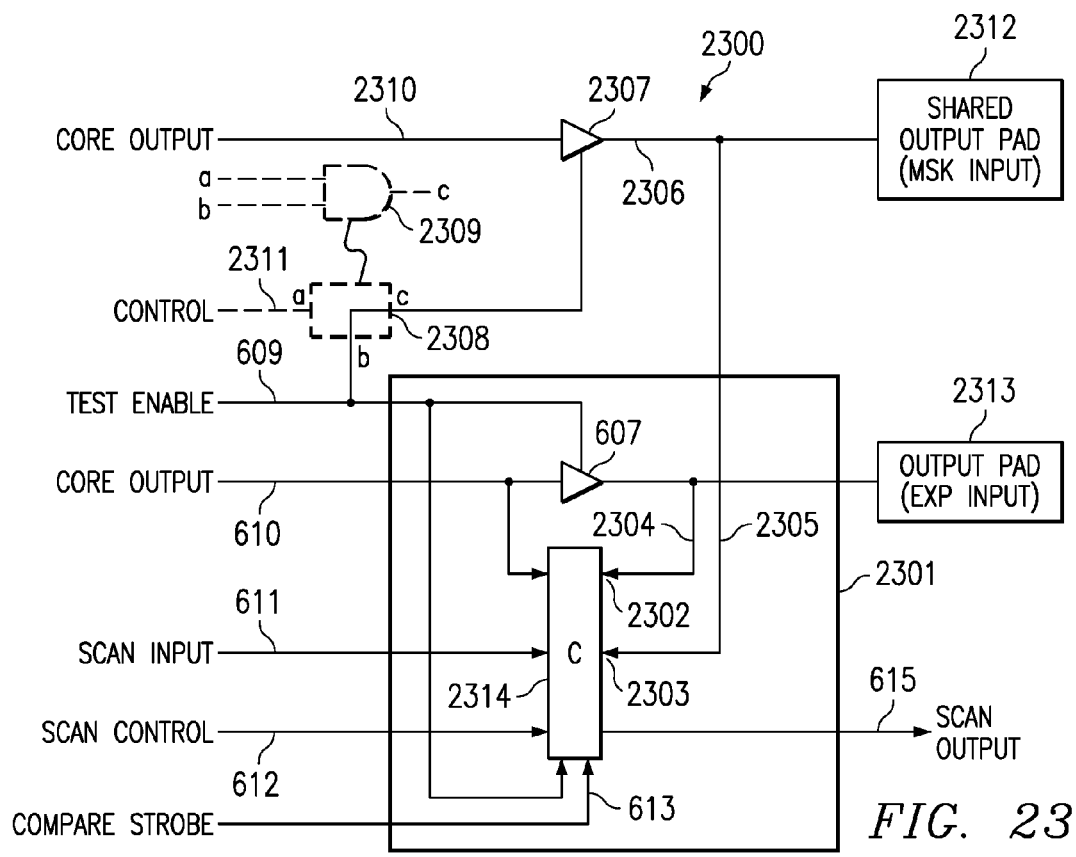
Figure 24:
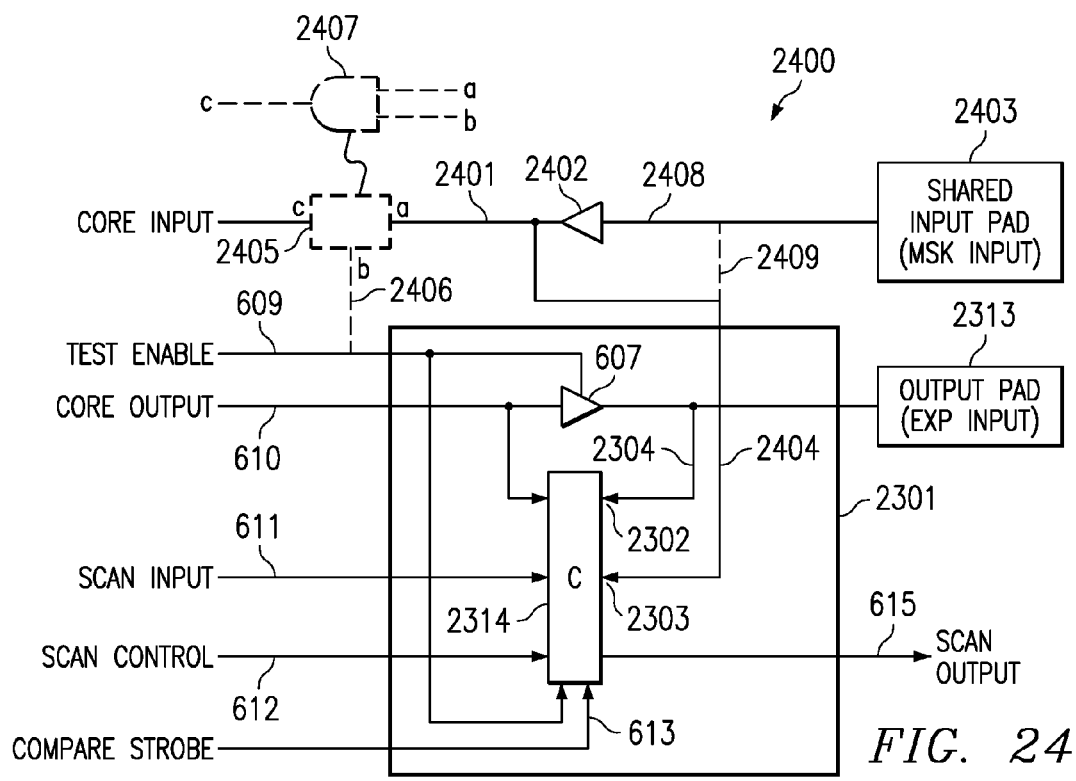
Figure 25A:
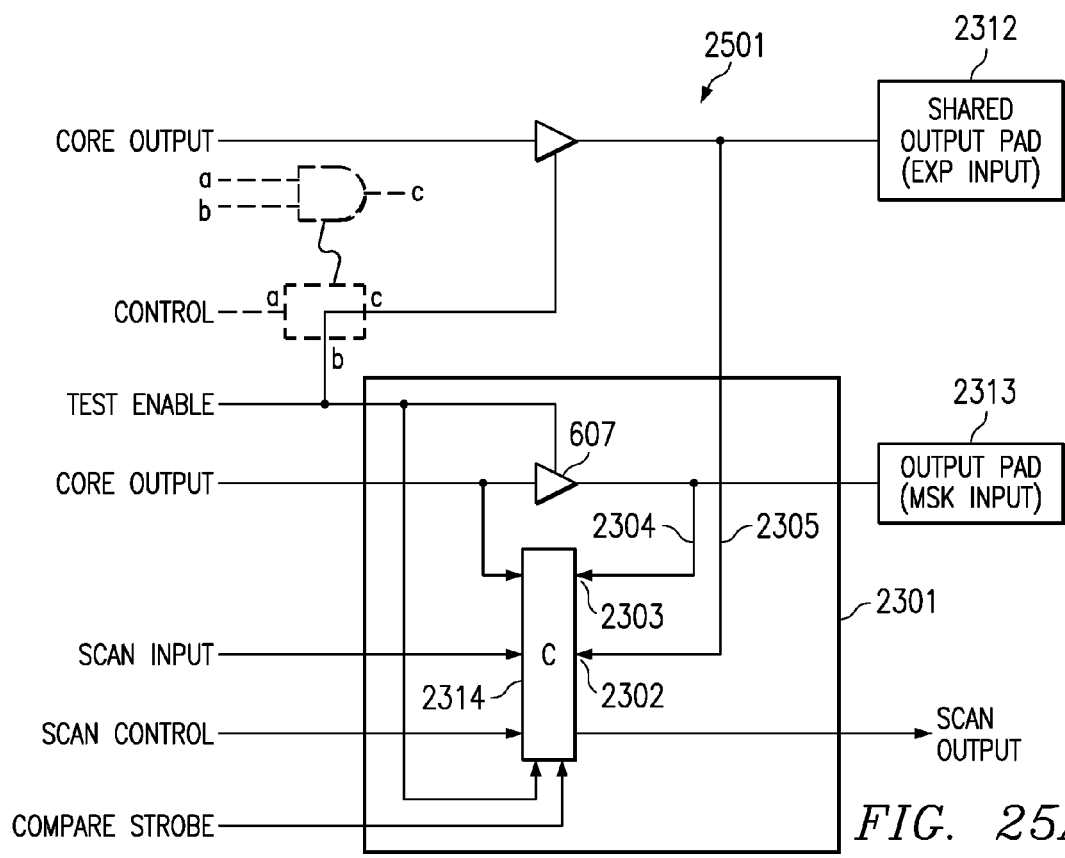
Figure 25B:
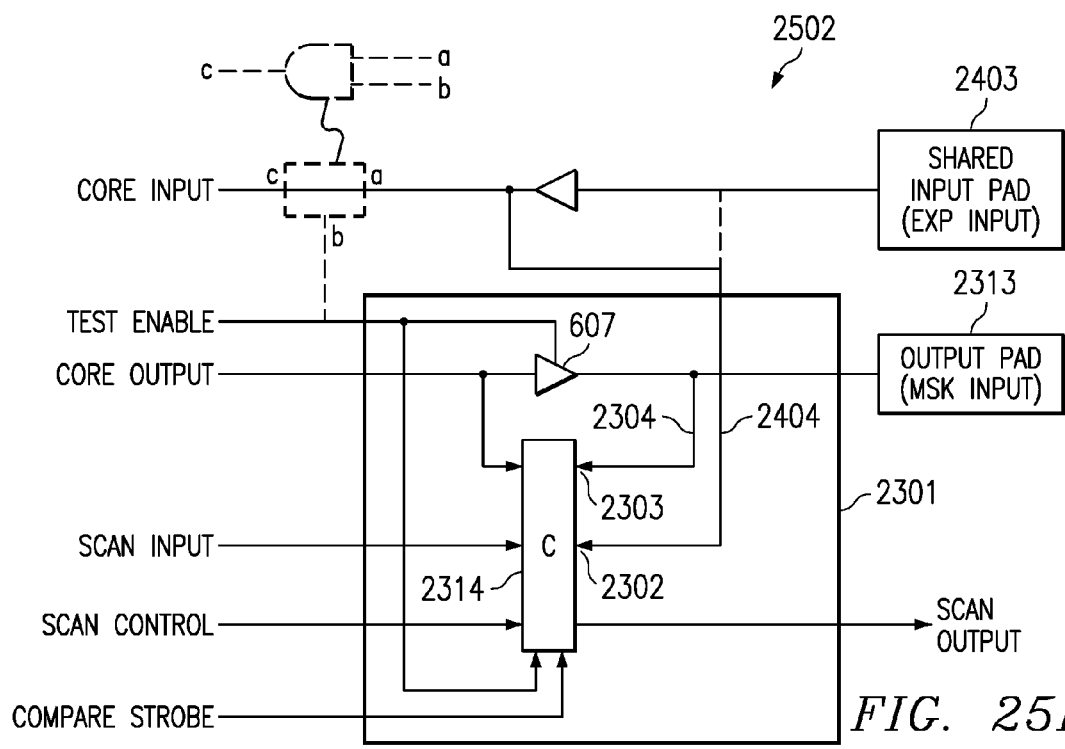
Figure 27:
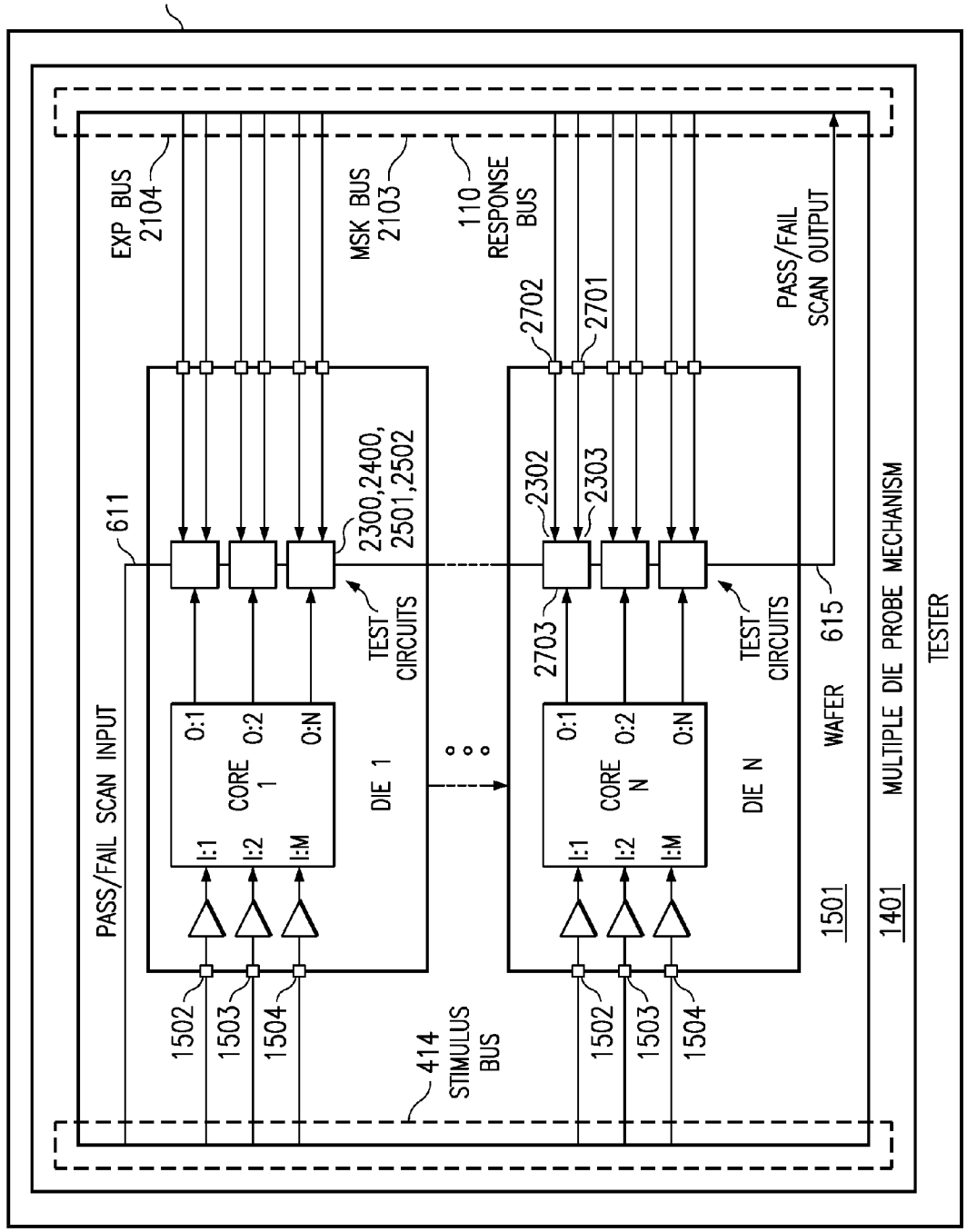
Figure 28:
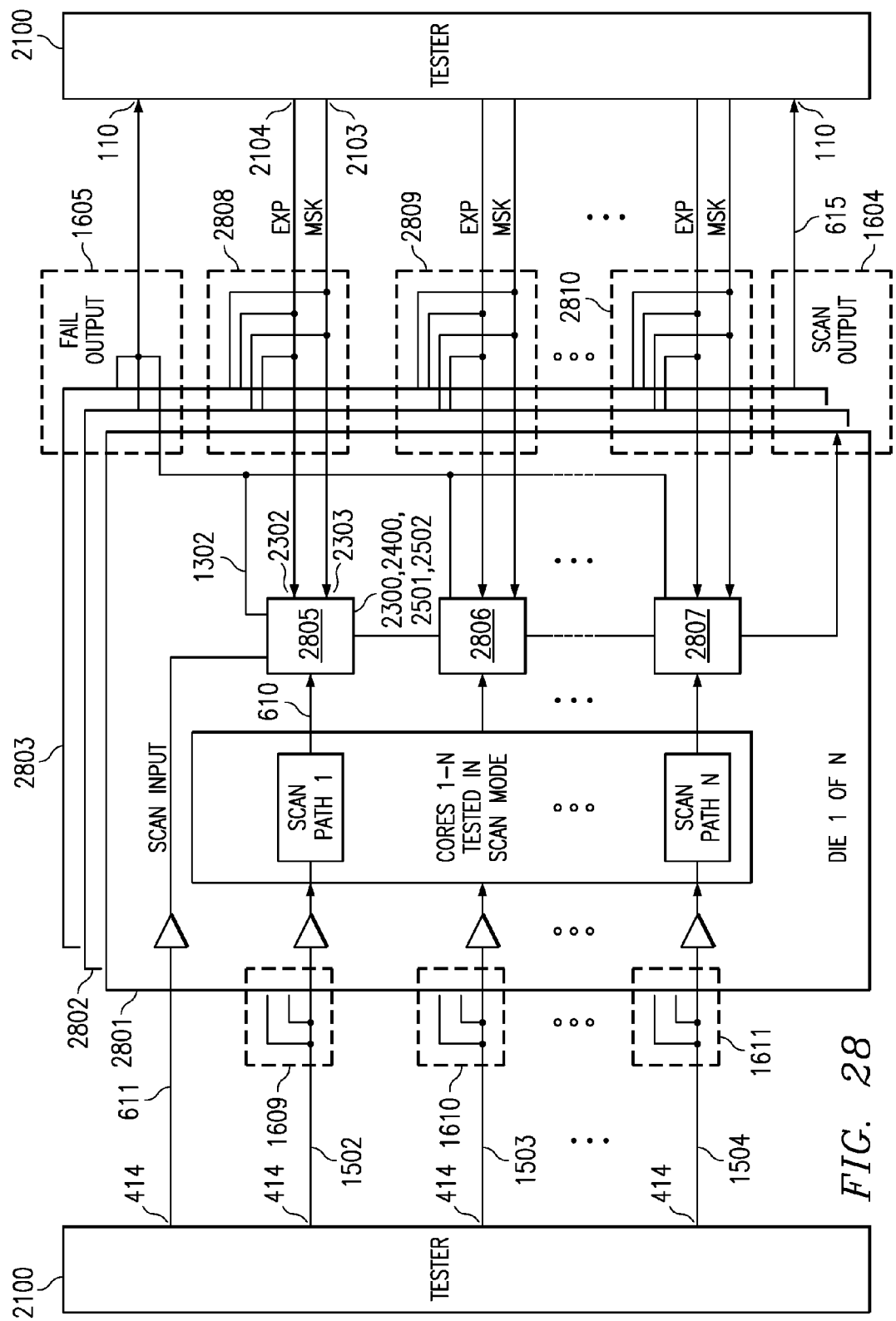
Figure 29:
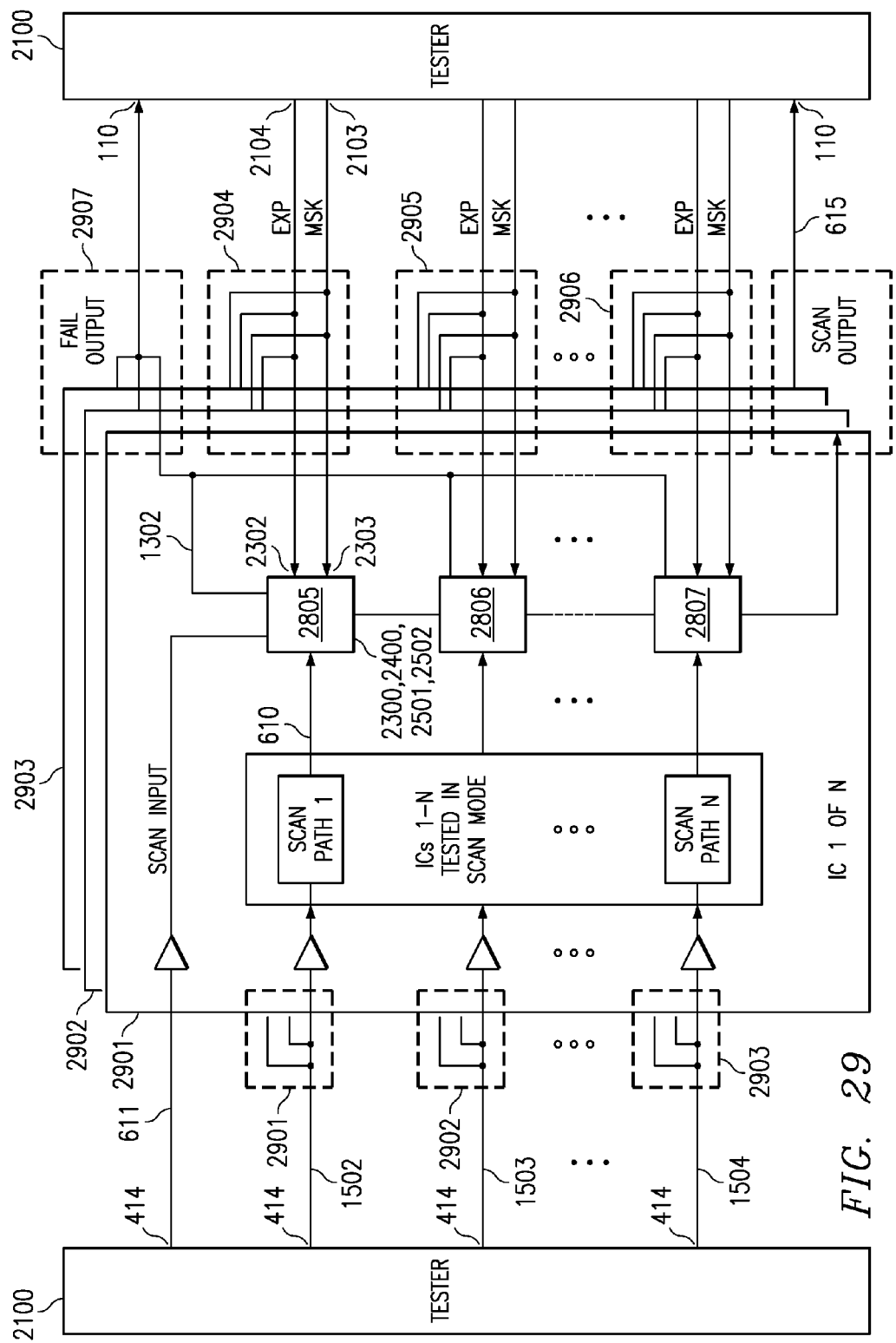

FIGS. 7A, 7B, and 7C are, respectively, a block diagram of the compare circuit of FIG. 6A, a truth table for that circuit and a block diagram of a pass/fail scan memory of that circuit;

FIGS. 8A and 8B are, respectively, a block diagram of a trinary circuit used in the circuit of FIG. 7A, and a truth table for that circuit;

FIGS. 9A and 9B are, respectively, a block diagram of a semiconductor die according to another aspect of the present disclosure and a block diagram of test circuits substituted for the conventional three state output buffer circuit on that die;

FIGS. 10A and 10B are, respectively, a block diagram of the compare circuit of FIG. 9B and a truth table of that circuit;

FIGS. 11A and 11B are, respectively, a block diagram of a semiconductor die according to another aspect of the present disclosure and a block diagram of test circuits substituted for the conventional input/output buffers on that die;

FIGS. 12A and 12B are, respectively, a block diagram of the compare circuit of FIG. 11B and a truth table of that circuit;

FIGS. 13A and 13B are, respectively, a block diagram of a pass/fail scan memory according to another aspect of the present disclosure and a block diagram of a test system including a bussed fail output lead;

FIG. 14 is a block diagram of a test system according to another aspect of the present disclosure;

FIG. 15 is a block diagram of an alternate view of the test system of FIG. 14;

FIG. 16 is a block diagram of the functional testing of the test system of FIG. 15;

FIG. 17 is a block diagram of parallel scan testing in the test system of FIG. 15;

FIGS. 18A and 18B are, respectively, a block diagram of a semiconductor die including multiple embedded IP core sub-circuits according to another aspect of the present disclosure and a block diagram of a test circuit substituted for an output buffer circuit of that die;

FIG. 19 is a block diagram of a test system including a semiconductor wafer including multiple dies and a tester;

FIG. 20 is a block diagram of another test system for multiple packaged integrated circuits, according to the process described in FIG. 14;

FIG. 21 is a block diagram of a tester similar to that of FIG. 4 with a different mask and expected driver circuitry;

FIGS. 22A and 22B are, respectively, a block diagram of one implementation of a mask driver and an expected data driver, and a truth table;

FIG. 23 is a block diagram of an output buffer and a test circuit connected between cores and output pads;

FIG. 24 is a block diagram of an input buffer connected to an input pad and a test circuit connected to an output pad;

FIGS. 25A and 25B are, respectively, block diagrams of alternate mask and expected data pad connections to test circuits;

FIGS. 26A, 26B, and 26C are, respectively, a block diagram of one example of a compare circuit, a truth table and a block diagram of a pass/fail scan memory;

FIG. 27 is a block diagram of the test system of FIG. 15 modified for use with the modified tester of FIG. 21 and the modified test circuits of FIGS. 23, 24, 25A and 25B;

FIG. 28 is a block diagram of the parallel scan testing of dies of FIG. 27;

FIG. 29 is a block diagram of parallel scan testing of integrated circuits according to the arrangement of FIG. 27; and FIG. 30 is a block diagram of the test circuit of FIG. 23 modified for testing multiple embedded IP cores.

DETAILED DESCRIPTION

Adapting Testers

FIG. 4 illustrates a tester 401 adapted according to the present disclosure. Tester 401 is similar to tester 105 in that it includes a controller 402 similar to controller 106, stimulus circuitry 403 similar to stimulus circuitry 108, and response circuitry 404. Controller 402 is connected to stimulus 403 and response 404 circuitry via interfaces 414 and 415 respectively. Response circuitry 404 includes the previously described response circuitry section 107 and a new response circuitry section 405. Response circuitry 405 is the previously mentioned adaptation of the tester to support the new response signaling technique for testing multiple die according the present disclosure.

Response circuitry 405 comprises an enable, mask, and expected data memory 406, and mask (M) and expected (E) data encoding circuitry 407. Memory 406 outputs a mask (MSK) data bus 410, expected (EXP) data bus 409, and an enable (ENA) bus 408 to encoding circuitry 407. Encoding circuitry 407 outputs an encoded response bus 411. The encoded response bus 411 of response circuitry 405 differs from the response bus 110 of response circuitry 107 in that the encoded response bus 411 is an output bus and the response bus 110 is an input bus. Both response busses 411 and 110 reside on the input/output bus 413 to response circuitry 404. The role of response bus 110 of circuit 107 is reduced when using tester 401 to test multiple die according to the present disclosure, as will be described later. Memory 406 of response circuitry 405 is accessed by the controller 402 via interface 415 to load data into memory 406 prior to testing, and to operate the memory 406 to output mask, expected, and enable data to encoding circuitry 407 during test.

FIG. 5A illustrates an example of one of a plurality of mask and expected data encoding circuits 501 existing within the mask and expected data circuit 407. Circuit 501 receives a mask data signal 512 from bus 410, an expected data signal 513 from bus 409, and an enable signal 514 from bus 408, and outputs an encoded response signal 511 on bus 411. The mask 512 and expected 513 data signals are input to decoder 501. Decoder 501 decodes the mask and expected signal inputs and outputs control signals 506-508 to the control input terminal of switches, for example transistors, 503-505. One contact terminal of switch 503 is connected to a ground reference voltage (Gnd) and the other terminal contact is connected to the input 509 of voltage follower amplifier 510. One contact terminal of switch 504 is connected to a positive reference voltage (Vdd) and the other terminal contact is connected to the input 509 of voltage follower amplifier 510. One contact terminal of switch 505 is connected to a mid-point reference voltage between Vdd and Gnd (½ Vdd) and the other terminal contact is connected to the input 509 of voltage follower amplifier 510. Amplifier 510 receives the enable input 514 to enable or disable its output.

In FIG. 5B, the operation of encoding circuit 501 is best understood via a truth table. When the enable input (ENA) 514 is low, the output of amplifier 510 is disabled from driving the encoded response output 511. When ENA 514 is high, the encoded response 511 output modes of circuit 501 are; (1) Gnd (Low) when mask data input 512 (MSK)=0 and expected data input 513 (EXP)=0, (2) Vdd (High) when MSK=0 and EXP=1, and (3) ½ Vdd (Mask) when MSK=1. So, the encoding circuit 501 responds to MSK 512, EXP 513, and ENA 514 inputs to output appropriate Disable, Low, High, or Mask conditions on the encoded response output 511. As mentioned, multiple circuits 501 will exist in the encoding circuit 407. For example, if the encoded response bus 411 contains 300 individual encoded response signals 511, 300 circuits 501 will exist in the encoding circuit 407. Also, the width of the MSK bus 410, EXP bus 409, and ENA bus 408 will be 300 signals wide each, to supply the MSK 512, EXP 513, and ENA 514 inputs to the 300 circuits 501.

Adapting Die

FIG. 6A illustrates how conventional 2-state output buffers of die 601 are adapted according to the present disclosure. Die 601 is similar to die 102 in that it includes input pads 602, output pads 603, input buffer 604, and core circuitry 605. Die 601 differs from die 102 in that it substitutes test circuits 606 for conventional 2-state output buffers 114.

FIG. 6B illustrates test circuit 606 in more detail. Test circuit 606 comprises a 3-state output buffer 607 coupled between the core output 610 and output pad 603, and a compare circuit 608. Compare circuit 608 inputs the core output signal 610, an input 614 from the output pad 603, a scan input signal 611, scan control signals 612, a test enable signal 609, and a compare strobe signal 613. Compare circuit 608 outputs a scan output signal 615. The test enable signal 609 is also connected to the control input of the 3-state output buffer 607. Test enable 609, scan control 612, and compare strobe 613 are inputs to the die 601 from tester 401 via stimulus bus 111. Scan input 611 and scan output 615 of multiple compare circuits 608 are daisy-chained to allow the tester 401 to serially input and output to multiple compare circuits 608 via stimulus bus 111 and response bus 112. It should be noted that in this example that output buffer 607 operates functionally as a 2-state output buffer. The reason buffer 607 is selected to be a 3-state type output buffer is for when test circuit 606 is placed into a test mode by the test enable input 609.

During functional operation of the die, test enable 609 is low which enables output buffer 607 and disables compare circuit 608. In functional mode, test circuit 606 operates as a conventional 2-state output buffer from die 601. During test mode operation of the die, test enable 609 is high which disables output buffer 607 and enables compare circuit 608. In test mode, test circuit 606 stops operating as a conventional 2-state output buffer and starts operating in the test mode as defined by the present disclosure. During test mode, tester 401 inputs encoded response signals from the encoded response bus 411 to compare circuit 608 via the output pad 603 and connection 614.

FIG. 7A illustrates the compare circuit 608 in more detail. Compare circuit 608 comprises trinary gate 701, exclusive OR (XOR) gate 702, AND gate 703, and pass/fail scan memory 704. Trinary gate 701 inputs an encoded response signal 511 from a circuit 501 via connection 614, and outputs an expected (EXP) data signal 705 and a mask (MSK) data signal 706. XOR gate 702 inputs the core output signal 610 and the EXP data output signal 705, and outputs a compare signal 707. An AND gate 708 inputs the compare signal 707 and the MSK data signal 706, and outputs a compare out signal 708. Pass/fail scan memory 704 inputs the compare out signal 708, compare strobe signal 613, scan input signal 611, scan control signals 612, and the test enable signal 609, and outputs the scan output signal 615. The test enable signal 609 is also input to trinary gate 701, XOR gate 702, and AND gate 703. When test enable is low (i.e. functional mode of die) it disables the operation of gates 701-707 such that they are not active to consume power or produce signal noise during functional operation of the die. Also while test enable 609 is low, the pass/fail latch (described below) of pass/fail scan memory 704 is initialized to the pass indication state.

FIG. 7C illustrates in more detail the pass/fail scan memory 704. Pass/fail scan memory 704 comprises pass/fail latch comprising a D-FF 709 (or other type of single bit memory) and OR gate 713, and a scan cell comprising multiplexer 710 and D-FF 711. The pass/fail latch (i.e. Or gate 713 and FF 709) receives the compare output 708, compare strobe 613, and test enable 609. Test enable 609 is input to the FF 709 reset input to initialize FF 709 to a pass indication condition. Compare strobe 613 is input to the FF 709 clock input. Compare out 708 and the Q output 712 of FF 709 are input to OR gate 713, which inputs to the D input of FF 709. The scan cell (i.e. multiplexer 710 and FF 711) receives the Q output 712 from FF 709, the scan input signal 611, and scan control inputs 612, and outputs the scan output signal 615.

Optionally, the scan cell may receive a boundary scan input 714 so that the scan cell may be used as the capture and shift stage of an IEEE 1149.1 boundary scan cell in addition to its use as a pass/fail indication scan cell by the present disclosure. The boundary scan input 714 would be connected to core output signal 610 to allow the scan cell to capture the data output from the core then shift the captured data from the IC, as described in the IEEE 1149.1 standard. The scan cell is operable in response to the scan control inputs 612 to capture the stored Q output signal 712 into FF 711 via multiplexer 710, then shift data from scan input 611 to scan output 615 via multiplexer 710.

The scan control inputs 612 may come from a tester as previously mentioned, or they may be selectively connected to a test port on the die, such as an IEEE 1149.1 test access port. When operating the scan cells 704 as IEEE 1149.1 capture shift and stage elements, the scan control 612 to the scan cells will be coupled to the 1149.1 test access port to allow IEEE 1149.1 control of the scan cells during boundary scan testing.

FIG. 7B depicts the operation of compare circuit 608 via a truth table. When the test enable 609 is low, compare circuit 608 is disabled except for the scan cell (710, 711) that remains operable to capture and shift data. The reason the scan cell remains enabled is because the scan cell may be shared between being used as a pass/fail indication scan cell by the present disclosure and also as an IEEE 1149.1 boundary scan cell associated with the output pad 603 of die 601, as mentioned above. The sharing of the scan cell as both a pass/fail indication scan cell and as an IEEE 1149.1 boundary scan cell advantageously reduces test circuit area in the die. When test enable 609 is high, the compare circuit 608 is enabled to perform testing according to the present disclosure.

While test enable 609 is high, a Gnd (Low) encoded response input 614 from tester 401 causes trinary gate 701 to output a high on MSK 706 and a low on EXP 705. This test condition compares for an expected low logic level on core output 610. If the core output 610 is low, the compare output 708 from gate 703 will input a low (pass condition) to pass/fail latch (713, 709). In response to the compare strobe 613 that accompanies each encoded response input 614 from the tester 401, the low input on compare output 708 will be clocked into FF 709 of the pass/fail latch to store the passing compare test result.

If the core output 610 is high, the compare output 708 will input a high (fail condition) to the pass/fail latch. Again, in response to the accompanying compare strobe 613, the high input on compare output 708 will be clocked into FF 709 to store the failing compare test result. If a high (a fail condition) is clocked into FF 709, FF 709 will latch up with a high (fail condition) on its Q output, via the connection 712 to OR gate 713, and remain latched high through out the remainder of test. This latch up is required to prevent the high (fail condition) from being overwritten during subsequent compare strobe inputs 613 to FF 709. This compare low operation of the present disclosure realizes the compare low operation described in regard to tester 105 of FIGS. 1C and 2.

While test enable 609 is high, a Vdd (High) encoded response input 614 from tester 401 causes trinary gate 701 to output a high on MSK 706 and a high on EXP 705. This test condition compares for an expected high logic level on core output 610. If the core output 610 is high, the compare output 708 from gate 703 will input a low (pass condition) to pass/fail latch (713, 709). In response to the accompanying compare strobe 613 the low input on compare output 708 will be clocked into FF 709 of the pass/fail latch to store the passing compare test result. If the core output 610 is low, the compare output 708 will input a high (fail condition) to the pass/fail latch. Again, in response to the accompanying compare strobe 613, the high input on compare output 708 will be clocked into FF 709 to store the failing compare test result.

As mentioned above, if a high (a fail condition) is clocked into FF 709, the pass/fail latch will latch up through out the remainder of the test to prevent the high failing condition from being overwritten during subsequent compare strobe inputs 613 to FF 709. This compare high operation of the present disclosure realizes the compare high operation described in regard to tester 105 of FIGS. 1C and 2.

While test enable 609 is high, a ½ Vdd (Mask) encoded response input 614 from tester 401 causes trinary gate 701 to output a low on MSK 706. The low on MSK 706 forces the compare out 708 output of AND gate 703 low, which forces a pass condition to be clocked into the pass/fail latch, independent of the logic level output 707 from XOR gate 702. The tester inputs a ½ Vdd (Mask) encoded response input to trinary gate 701 whenever it is not desired to perform a compare operation against the logic level on core output 610. This mask operation of the present disclosure realizes the mask operation described in regard to tester 105 of FIGS. 1C and 2.

FIG. 8A illustrates an example trinary gate 701 circuit. Trinary gate 701 comprises p-channel transistor 801, current source 802, current source 803, n-channel transistor 804, OR gate 805, inverter 806, and transmission gate switches 807 and 808. Transistor 801 and current source 802 form a first path between Vdd and Gnd. Transistor 804 and current source 803 form a second path between Vdd and Gnd. A first node between transistor 801 and current source 802 is connected to an inverted input of OR gate 805. A second node between transistor 804 and current source 803 is connected to the other input of OR gate 805 and to inverter 806. The output of OR gate 805 is the Mask (MSK) Data signal 706. The output of inverter 806 is the Expected (EXP) Data signal 705. The test enable signal 609 is connected as a control input to switches 807 and 808. When test enable 609 is low, switch 807 connects the gate input of transistor 801 to Vdd and switch 808 connects the gate input of transistor 804 to Gnd, turning both transistor off and setting the first and second nodes low and high respectively. When test enable 609 is high, switches 807 and 808 connect the gate inputs of transistors 801 and 804 to the encoded response signal 614, enabling the transistors to respond to the encoded response signal.

FIG. 8B depicts the operation of trinary gate 701 via a truth table. When the test enable 609 is low, transistors 801 and 804 are disabled from responding to the encoded response signal 614 and the MSK 706 and EXP 705 outputs are forced high and low respectively. While test enable 609 is low, the trinary gate 701 is disabled to reduce power consumption and noise during functional mode of the die, as previously mentioned. While test enable 609 is high, and when a Gnd (Low) signal is input on the encoded response input 614, the first and second nodes are high, producing a high on MSK signal 706 and a low on EXP signal 705. While test enable 609 is high, and when a Vdd (High) signal is input on the encoded response input 614, the first and second nodes are low, producing a high on MSK signal 706 and a high on EXP signal 705. While test enable 609 is high, and when a ½ Vdd (Mask) signal is input on the encoded response input 614, the first node is high and the second node is low, producing a low on MSK signal 706 and a high on EXP signal 705. During a ½ Vdd (Mask) input, the logic level output on the EXP 705 signal is indicated in the truth table as a don't care (X) since the compare operation is masked by the low on MSK signal 706.

While not shown, the test enable signal 609 input to XOR gate 702 and AND gate 703 can be used to disable their input threshold transistors and set their outputs to static DC low states similar to the way it is shown doing so in the trinary gate 701 of FIG. 8A. Again, this is done to reduce power and noise of comparators 608 during functional operation of die 601.

FIG. 9A illustrates how conventional 3-state output buffers of die 601 are adapted according to the present disclosure. Die 601 of FIG. 9A is the same as die 601 of FIG. 6A with the exception that FIG. 9A illustrates how test circuits 906 are substituted for conventional 3-state output buffers between core 605 and 3-state output pads 903. Similar to die 601 of FIG. 6A, die 601 of FIG. 9A includes input pads 602, input buffers 604, core circuitry 605, and 3-state output pads 903 as opposed to 2-state output pads 603 in FIG. 6A. Die 601 of FIG. 9A differs from die 601 of FIG. 6A in that it illustrates the substitution of test circuits 906 for conventional 3-state output buffers at output pads 903, instead of the substitution of test circuits 606 for conventional 2-state output buffers at pads 603.

FIG. 9B illustrates test circuit 906 in more detail. Test circuit 906 comprises a 3-state output buffer 907 coupled between the core output 910 and output pad 903, an AND gate 901, and a compare circuit 908. AND gate 901 receives an output control signal 911 from core 605 on one input and an inverted test enable signal 609 on the other input. The AND gate 901 outputs a 3-state control signal 902 to the 3-state buffer 907. Compare circuit 908 inputs the core output signal 910, core output control signal 911, an input 914 from the output pad 903, a scan input signal 611, scan control signals 612, a test enable signal 609, and a compare strobe signal 613. Compare circuit 908 outputs a scan output signal 615. Scan input 611 and scan output 615 of multiple compare circuits 908 and 608 are daisy-chained to allow the tester 401 to serially input and output to multiple compare circuits 908 and 608 via stimulus bus 111 and response bus 112. It should be noted that in this example that output buffer 907 operates functionally as a 3-state output buffer, as opposed to output buffer 607 of FIG. 6B which operates functionally as a 2-state output buffer. As with buffer 607, the output of buffer 907 is disabled when test circuit 906 is placed into a test mode by the test enable input 609, via AND gate 901.

During functional operation of the die, test enable 609 is low which enables output control signal 911 from core 605 to pass through gate 901 to functionally enable and disable output buffer 907. In this example, and during functional operation, a low input on output control 911 will disable the output of output buffer 907, and a high input on output control 911 will enable the output of output buffer 907. When output control in low, Also a low on test enable 609 disables compare circuit 908. In functional mode, test circuit 906 operates as a conventional 3-state output buffer from die 601. During test mode operation of the die, test enable 609 is high which disables output buffer 907, via gate 901, and enables compare circuit 908. In test mode, test circuit 906 stops operating as a conventional 3-state output buffer and starts operating in the test mode as defined by the present disclosure. During test mode, tester 401 inputs encoded response signals from the encoded response bus 411 to compare circuit 908 via the output pad 903 and connection 914.

FIG. 10A illustrates the compare circuit 908 in more detail. Compare circuit 908 comprises trinary gate 701, XOR gate 702, AND gate 1003, and pass/fail scan memory 704. Trinary gate 701 inputs an encoded response signal 511 from a circuit 501 via connection 914, and outputs an expected (EXP) data signal 705 and a mask (MSK) data signal 706. XOR gate 702 inputs the core output signal 910 and the EXP data output signal 705, and outputs a compare signal 707. AND gate 708 inputs the compare signal 707, output control signal 911, and the MSK data signal 706, and outputs a compare out signal 1008. Pass/fail scan memory 704 inputs the compare out signal 1008, compare strobe signal 613, scan input signal 611, scan control signals 612, and the test enable signal 609, and outputs the scan output signal 615. The test enable signal 609 is also input to trinary gate 701, XOR gate 702, and AND gate 1003 to reduce power consumption and noise during functional die operation, as described previously in regard to comparator 608. The pass/fail scan memory operates as previously described in regard to FIG. 7C.

FIG. 10B depicts the operation of compare circuit 908 via a truth table. When the test enable 609 is low, compare circuit 908 is disabled except for the scan cell (710, 711) of pass/fail scan memory 704 to enable sharing of the scan cell as both a pass/fail indication scan cell and as an IEEE 1149.1 boundary scan cell as mentioned in regard to FIG. 7C. When test enable 609 is high, the compare circuit 908 is enabled to perform testing according to the present disclosure.

While test enable 609 and output control 911 is high, a Gnd (Low) encoded response input 914 from tester 401 causes trinary gate 701 to output a high on MSK 706 and a low on EXP 705. This test condition compares for an expected low logic level on core output 910. If the core output 910 is low, the compare output 1008 from gate 1003 will input a low (pass condition) to pass/fail latch (713, 709). In response to the accompanying compare strobe 613, the low input (pass condition) is stored into the pass/fail latch, as previously described in regard to FIG. 7C. If the core output 910 is high, the compare output 1008 will input a high (fail condition) to the pass/fail latch. In response to the accompanying compare strobe 613 the high (fail condition) is stored and latched in pass/fail latch as previously described in regard to FIG. 7C.

While test enable 609 and output control 911 is high, a Vdd (High) encoded response input 914 from tester 401 causes trinary gate 701 to output a high on MSK 706 and a high on EXP 705. This test condition compares for an expected high logic level on core output 910. If the core output 910 is high, the compare output 1008 from gate 1003 will input a low (pass condition) to pass/fail latch (713, 709). In response to the accompanying compare strobe 613, the low input (pass condition) is stored into the pass/fail latch, as previously described in regard to FIG. 7C. If the core output 910 is low, the compare output 1008 will input a high (fail condition) to the pass/fail latch. In response to the accompanying compare strobe 613 the high (fail condition) is stored and latched in the pass/fail latch as previously described in regard to FIG. 7C.

While test enable 609 and output control 911 is high, a ½ Vdd (Mask) encoded response input 914 from tester 401 causes trinary gate 701 to output a low on MSK 706. The low on MSK 706 forces the compare out 1008 output of AND gate 1003 low, which forces a low (pass condition) to be stored into the pass/fail latch in response to the accompanying compare strobe 613, independent of the logic level output 707 from XOR gate 702. The tester inputs a ½ Vdd (Mask) encoded response input to trinary gate 701 whenever it is not desired to perform a compare operation against the logic level on core output 910, as previously described in regard to FIGS. 7A and 7B.

While test enable 609 is high and output control 911 is low, a low (pass condition) is forced on the compare output 1008 of AND gate 1003. This forces a low (pass condition) to be stored into the pass/fail latch in response to the accompanying compare strobe 613, independent of the logic level output 707 from XOR gate 702. This forced pass condition is different from the forced pass condition controlled by tester 401 using the ½ Vdd input, since the core's output control signal 911 regulates the masking of the compare operation.

This new mode of compare masking enables testing the core's output control signal 911. For example, if, during a time in the test when the output control signal 911 should be low, an intentionally failing encoded response signal 914 can be input to the trinary gate 701. If the control output signal 911 is functioning properly, it will mask the intentional failure input and force the compare output 1008 of gate 1003 low (pass condition). However, if the output control signal 911 fails to function properly, it will not mask the intentional failure input and the compare output signal 1008 will be set high (fail condition). There is a possibility that a faulty core output signal 910 may compare equal to the intentional failure input signal 914, which will mask the test for a faulty output control signal 911.

For example, a faulty output control signal 911 may remain high (first fault) to allow a faulty core output signal 910 to pass the compare test (second fault) and input a low (pass condition) to the pass/fail latch. To test for this possibility, two tests are run. A first test using the intentional failure input, and a second test using the actual expected data input. If both tests pass, then both the output control signal 911 and core output signal 910 are functioning properly.

FIG. 11A illustrates how conventional input/output (I/O) buffers of die 601 are adapted according to the present disclosure. Similar to die 601 of FIG. 9A, die 601 of FIG.

11A includes input pads 602, input buffers 604, core circuitry 605, and I/O pads 1103 as opposed to 2-state and 3-state output pads 603 and 903 in FIGS. 6A and 9A. Die 601 of FIG. 11A differs from die 601 of FIGS. 6A and 9A in that it substitutes test circuits 1106 for conventional I/O buffers at output pads 1103, instead of the substitution of test circuits 606 and 906 for conventional 2-state and 3-state output buffers at pads 603 and 903.

FIG. 11B illustrates test circuit 1106 in more detail. Test circuit 1106 comprises a 3-state output buffer 907 coupled between core output 1110 and I/O pad 1103, an input buffer 1115 coupled between I/O pad 1103 and core input 1112, an AND gate 901, and a compare circuit 908. AND gate 901 receives an I/O control signal 1111 from core 605 on one input and an inverted test enable signal 609 on the other input. The AND gate 901 outputs a 3-state control signal 902 to the 3-state buffer 907. Compare circuit 908 inputs the core output signal 1110, core I/O control signal 1111, an input 1114 from I/O pad 1103, a scan input signal 611, scan control signals 612, a test enable signal 609, and a compare strobe signal 613. Compare circuit 908 outputs a scan output signal 615. Scan input 611 and scan output 615 of multiple compare circuits 908 and 608 are daisy-chained to allow the tester 401 to serially input and output to multiple compare circuits 908 and 608 via stimulus bus 111 and response bus 112.

FIG. 12B shows the compare circuit 908 of FIG. 11B in more detail. The structure and operation of compare circuit 908 of FIG. 12A is the same as compare circuit 908 of FIG. 10A. The only structural difference between the two compare circuits 908 is that the I/O control signal 1111 of FIG. 12A has been substituted for the output control signal 911 of FIG. 10A.

In FIG. 12B, compare circuit 908 of FIG. 12A performs all the truth table functions of compare circuit 908 of FIG. 10A. In addition to these functions, compare circuit 908 of FIG. 12A supports the input stimulus function described below.

Figure 1:
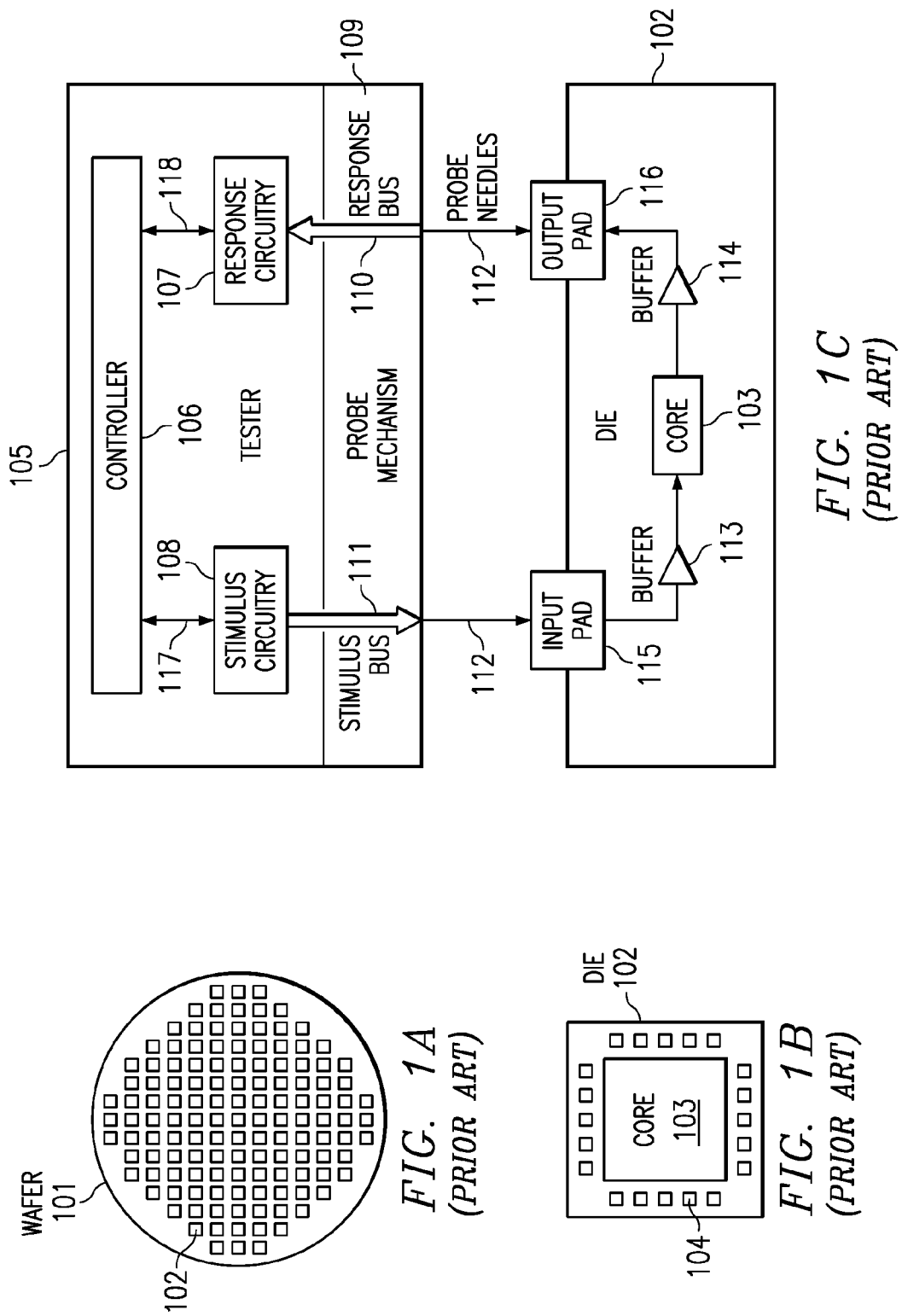
FIGS. 1A, 1B and 1C are block diagrams, respectively, of a semiconductor wafer containing plural dies, an individual semiconductor die, and a semiconductor tester connected to a die.
Figure 2:
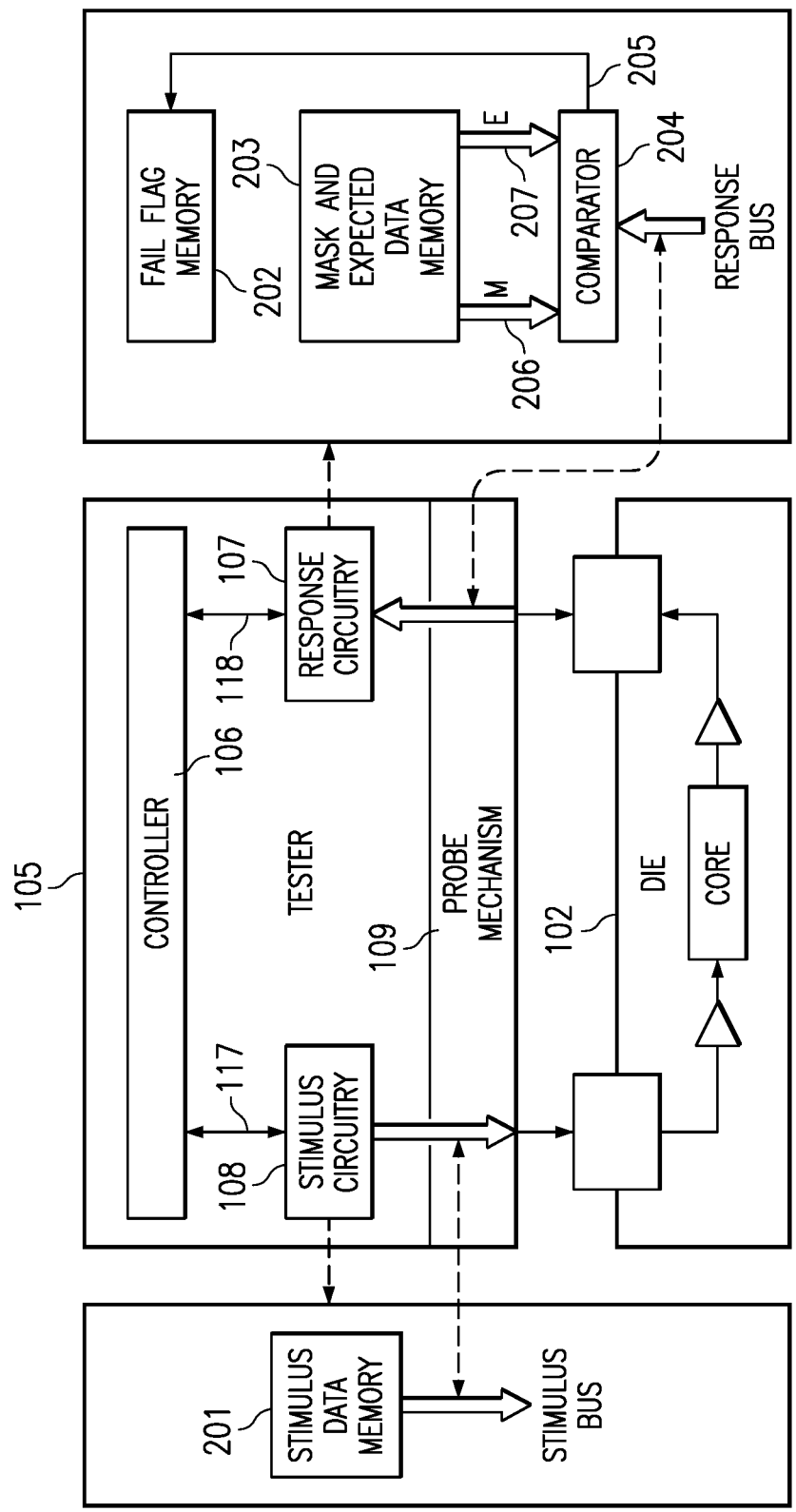
FIG. 2 is a block diagram of the parts of the tester.

During conventional testing, tester 105 of FIG. 1C inputs stimulus via stimulus bus 111 and outputs response via response bus 110 to conventional IC I/O pads. During testing according to the present disclosure, tester 401 of FIG. 4 inputs stimulus using either stimulus bus 414 or encoded response bus 411, and outputs encoded response via encoded response bus 411 to IC I/O pads 1103. In either test case, the I/O control signal 1111 will select the input or output function by controlling the output condition of 3-state buffer 907. For example, when the I/O control signal 1111 of test circuit 1106 in FIG. 11B is set low, the output of the 3-state buffer 907 is disabled to allow the tester 401 to input stimulus to core 605 from I/O pad 1103.

The stimulus input from the tester 401 is input using conventional logic low (Gnd) and high (Vdd) voltage levels, which as mentioned can come from either the stimulus bus 414 or encoded response bus 411. As seen in FIG. 12A, the low on I/O control signal 1111 that selects the stimulus input mode also forces the output 1008 of AND gate 1003 low to input pass conditions to pass/fail flag in pass/fail scan memory 704. This is done to prevent a high (fail condition) from being unintentionally stored and latched in the pass/fail flag, in response to accompanying compare strobes 613, during times when the tester 401 is inputting stimulus.

As mentioned previously in regard to FIG. 3, production testing of multiple die preferably runs to completion without regard to one or more die incurring failures during the test. However, during diagnostic testing of multiple die it is advantageous to be able to detect a first failure to allow determining the exact test pattern that caused the failure. To provide for diagnostic testing using the present disclosure, the pass/fail scan memory 704 is modified as follows.

In FIG. 13A, the pass/fail scan memory 704 is shown to include an additional transistor 1301. The transistor has one terminal connected to Gnd and the other terminal connected to a fail output signal 1302, which is externally output from the pass/fail scan memory 704. The gate input of transistor 1301 is connected to the Q output signal 712 of FF 709. While the Q output 712 is low (pass condition), the transistor is off and the fail output signal 1302 is isolated from Gnd. When the Q output is high (fail condition), the transistor is on and a conduction path is enabled between fail output signal 1302 and Gnd. As can be seen, transistor 1301 operates as an open drain, isolating the fail output signal 1302 from Gnd while Q is low (pass condition), and connecting the fail output signal 1302 to Gnd when Q is high (fail condition).

FIG. 13B illustrates a die 1303 coupled to a tester 401. Die 1303 includes mixtures of the previously described test circuits 608 and 908. The test circuits 608 and 908 each contain the pass/fail fail output 1302 equipped scan memory 704 of FIG. 13A. The fail outputs 1302 of each test circuit 608 and 908 are externally available to be connected to a bussed fail output signal 1304 within the die. The bussed fail output signal 1304 is also connected to a current source 1305, which serves as a pull element for the bussed fail output signal 1304. The bussed fail output signal 1304 is externally output from the die as a fail output to tester 401. While the pull up element 1304 is shown existing inside the die, it could exist external of the die as well, i.e. the tester 401 could provide the pull up element 1305.

Diagnostic testing of multiple die 1303 using the present disclosure is similar to the previously described production test using the present disclosure. However, unlike production testing, diagnostic testing will be halted upon the first compare failure to enable identification of the die test pattern that failed, so that the nature of the failure may be analyzed. During diagnostic testing, the test circuits 608, 908 of the multiple die perform the compare operations between the core outputs 610, 910, 1110 and encoded response inputs 614, 914, 1114.

As can be seen from FIG. 13A, when a first high (fail condition) is stored and latched in FF 709, the gate of transistor 1301 is driven high by the Q output of FF 709. With the gate input high, the transistor 1301 is on and forms a conduction path between fail output 1302 and Gnd. As can be seen in FIG. 13B, when one or more transistors 1301 turn on in response to a fail condition, the bussed fail output connection 1304 is pulled low (Gnd) The tester responds to this low level transition on the fail output to halt the diagnostic test and to scan out the pass/fail flags of the daisy-chained test circuits 608/908. By inspecting the scanned out pass/fail flag bits, the tester can determine which one or more core output signal(s) failed. Thus the present disclosure supports diagnostic testing of multiple die if the pass/fail scan memory 704 of FIG. 13A is used in place of the previously described pass/fail scan memory 704 of FIG. 7C.

FIG. 14 illustrates a test system according to the present disclosure. The test system comprises a tester 401, a multiple die probe mechanism 1401, and dies 1-N to be tested. The probe mechanism 1401 is similar to the probe mechanism 301 of FIG. 3 in that it has a stimulus channel 302 for probing all common input pads 303 of die 1-N. Probe mechanism 1401 differs from probe mechanism 301 in that it has an encoded response channel for probing all common output pads 1402 of die 1-N. During test, all die 1-N receive a common stimulus input on each common input pad input 303, and all die 1-N receive a common encoded response input on each common output pad 1402.

Figure 3:
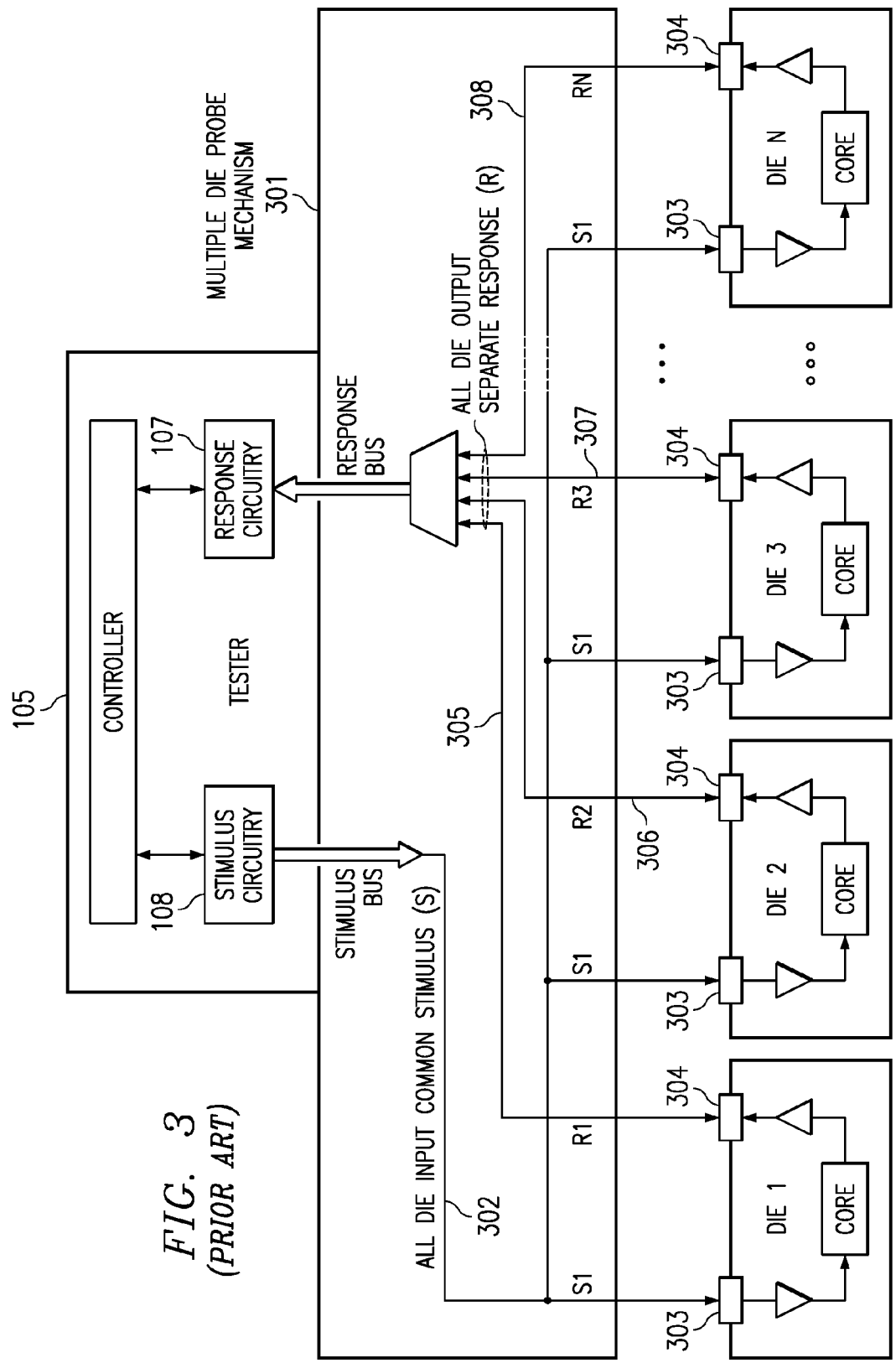
FIG. 3 is a block diagram of a tester connected to plural dies.

From inspection of the probe mechanism 1401, the test system of the present disclosure does not suffer from the previously mentioned tester response channel limitation mentioned in regard to the conventional test system of FIG. 3. For example, if the tester 401 has 300 stimulus channels and 300 response channels, and die 1-N have 300 or less input pads and 300 or less output pads, any number of die 1-N may be simultaneously tested using the test system of the present disclosure. Thus, use of the test system of FIG. 14 reduces the test time of the die on wafer, and therefore reduces the cost to manufacture the die.

FIG. 15 illustrates an alternate view of the test system of FIG. 14. Tester 401 is illustrated as the outer layer, probe mechanism 1401 is illustrated as being inside the tester 401 layer, and wafer 1501 with die 1-N is illustrated as being inside the probe mechanism layer 1401. Each die 1-N are identical and each have inputs 1-M connected to input pads 1502-1504 and 2-state outputs 1-N connected to output pads 1505-1507.

The stimulus bus 414 from the tester passes through the probe mechanism to the die input pads 1502-1504. The encoded response bus 411 and response bus 110 from the tester pass through the probe mechanism to the die output pads 1505-1507. Common input pads 1502 of die 1-N are connected together and to one stimulus channel from stimulus bus 414 via the probe mechanism, common input pads 1503 are connected together and to another stimulus channel from stimulus bus 414 via the probe mechanism, and inputs pads 1504 are connected together and to a further stimulus channel from stimulus bus 414 via the probe mechanism. Common output pads 1505 of die 1-N are connected together and to one encoded response channel from encoded response bus 411 via the probe mechanism, common output pads 1506 are connected together and to another encoded response channel from encoded response bus 411 via the probed mechanism, and common output pads 1507 are connected together and to a further encoded response channel from encoded response bus 411 via the probe mechanism.

The pass/fail scan input 611 from the tester passes through the probe mechanism 1401 to the scan input of die 1, through the daisy-chained scan path of die 1-N to be output on the pass/fail scan output 615 to the tester via probe mechanism 1401. The scan input 611 uses one of the stimulus input channels of stimulus bus 414 and the scan output uses one of the response output channels of response output bus 110.

While the scan control signals 612, test enable signal 609, and compare strobe signal 613 are not explicitly shown in FIG. 15, they are also connected to die 1-N inputs 1-M via stimulus channels from stimulus input bus 414. While test circuits 606 are shown existing on die 1-N 2-state output pads 1505-1507, it should be clear that test circuits 906 would exist on die 1-N 3-state output pads 1505-1507, and test circuits 1106 would exist on die 1-N I/O pads 1505-1507.

If test circuits 1106 were used on die I/O pads 1505-1507, then the encoded response bus 411 would be used to input stimulus data to the I/O pads 1505-1507, via probe mechanism 1401, as described in regard to FIGS. 12A and 12B. Thus in this example, the encoded response bus 411 serves the dual role of; (1) inputting encoded response signals to I/O pads during compare/mask operations, and (2) inputting stimulus data to I/O pads during stimulus input operations.

FIG. 16 illustrates in detail the functional testing of die 1-N (1601-1603) of FIG. 15. Tester 401 inputs stimulus from stimulus bus 414 to common die inputs 1502-1504 via the connections 1609-1611, to allow all die 1-N to receive the same stimulus at their common inputs during test. Connections 1609-1611 are provided by the probe mechanism 1401 of FIGS. 14 and 15. Also, tester 401 inputs stimulus from stimulus bus 414 to the scan input 611 of die 1 via the probe mechanism.

Tester 401 inputs encoded response inputs from encoded response bus 411 to common die outputs and I/Os 1505-1507 via the connections 1606-1608, to allow all die 1-N to receive the same encoded response inputs at their common outputs and I/Os during test. Connections 1606-1608 are provided by the probe mechanism 1401 of FIGS. 14 and 15. Tester 401 inputs a combined fail output signal from die 1-N to response bus 110 via the fail output connection 1605 provided by the probe mechanism. Also, tester 401 inputs the scan output signal 615 from die N to the response bus 110. Connection 1604 illustrates the daisy-chaining of the pass/fail scan output from die 1 to the pass/fail scan input of die 2, and so on to die N. Connection 1604 is provided by the probe mechanism. As seen in FIG. 16, encoded response input 1505 is coupled to 1-N 2-state test circuits 606, encoded response input 1506 is coupled to 1-N 3-state test circuits 906, and encoded response input 1507 is coupled to 1-N I/O test circuits 1106.

During test, tester 401 places the die 1-N in the test mode of the present disclosure and inputs stimulus patterns to die 1-N inputs via connections 1502-1504 and inputs encoded response patterns to die 1-N test circuits 606, 906, and 1106 via connections 1505-1507. In response to the functional patterns to the inputs and I/Os, die 1-N operates to output data to test circuits 606, output data and control to test circuits 906, and input and output data and control to test circuits 1106. During the test, tester 401 inputs the compare strobe to test circuits 606, 906, and 1106 as previously described to store the compare results between the functional output data and the encoded response input data from the tester.

If the test is a production test, the fail output from connection 1605 is ignored during the test for the reasons previously mentioned in regard to FIG. 3. If the test is a diagnostic test, the fail output from connection 1605 is monitored by the tester 401 for the reasons previously mentioned in regard to FIGS. 13A and 13B. At the end of a functional production test or at the stopping of a functional diagnostic test, tester 401 scans out the pass/fail flags in the pass/fail scan memories of die 1-N via the scan input 611 and scan output 615 connections. From the pass/fail scan operation; the tester can determine if a failure occurred in die 1-N and if so identify the location of the failure.

FIG. 17 illustrates in detail the parallel scan testing of die 1-N (1701-1703) of FIG. 15. The difference between die 1-N of FIG. 16 and die 1-N of FIG. 17 is that die 1-N of FIG. 17 have been designed to be tested using a parallel scan design for test approach, whereas die 1-N were not and had to be tested functionally. When die 1-N are placed in the parallel scan test configuration, the data inputs of scan paths 1-N are connected to die inputs 1502-1504 and the data outputs of scan paths 1-N are connected to the inputs 910 of test circuits 606. Tester 401 inputs scan stimulus from bus 414 to die 1-N scan paths 1-N via the common die input connections 1502-1504 and 1609-1611, to allow all die 1-N to receive the same scan stimulus during test. Also, tester 401 inputs stimulus from bus 414 to the scan input 611 of die 1 via the probe mechanism.

Tester 401 inputs encoded scan response from bus 411 to common die output connections 1505-1507 and 1606-1608, to allow all die 1-N to compare against the same response during test. Tester 401 inputs a combined fail output signal from die 1-N to response bus 110 via the fail output connection 1605. Also, tester 401 inputs the scan output signal 615 from die N to the response bus 110. Connection 1604 illustrates the daisy-chaining of the pass/fail scan output from die 1 to the pass/fail scan input of die 2, and so on to die N. As seen in FIG. 17, encoded scan response inputs 1505-1507 are coupled to 1-N 2-state test circuits 606.

During test, tester 401 places the die 1-N in the test mode of the present disclosure and inputs stimulus patterns to scan paths 1-N of die 1-N via inputs 1502-1504 and inputs encoded response patterns to test circuits 606 of die 1-N via outputs 1505-1507. The scan paths operate, in response to conventional scan path control input from tester 401, to shift in the stimulus patterns from inputs 1502-1504, capture response patterns, and shift out the captured response patterns to test circuits 606. During the test, tester 401 inputs the compare strobe to test circuits 606 as previously described to store the compare results between the captured response data from scan paths 1-N and the encoded response input data from tester 401. If the test is a production test, the fail output from connection 1605 is ignored during the test for the reasons previously mentioned in regard to FIG. 3.

If the test is a diagnostic test, the fail output from connection 1605 is monitored by the tester 401 for the reasons previously mentioned in regard to FIGS. 13A and 13B. At the end of a parallel scan production test or at the stopping of a parallel scan diagnostic test, tester 401 scans out the pass/fail flags in the pass/fail scan memories of die 1-N via the scan input 611 and scan output 615 connections. From the pass/fail scan operation; the tester can determine if a failure occurred in die 1-N and if so identify the location of the failure.

It is becoming increasingly popular to design systems on ICs using pre-existing intellectual property core sub-circuits. Core sub-circuits provide embeddable functions such as DSP, CPU, and RAM.

FIG. 18A illustrates an IC comprising embedded cores 1-3. The cores are connected together via functional connections 1814 and 1815 to form a system on the IC. The following describes how such systems on ICs can be tested using the present disclosure.

To test the embedded cores 1-3 of IC 1802, test connections 1810 and connection circuits 1808 and 1809 are added to allow input pads 1803 to be selectively connected to the inputs of cores 1-3. Also test connections 1811, 1812 and 1818 are added to allow the outputs of cores 1-3 to be connected to test circuits 1813, which are coupled to output pads 1802.

In FIG. 18B, test circuit 1813 is similar to test circuit 606 with the exception that it contains a multiplexer 1816 for receiving core 1-3 outputs 1811, 1812, and 1818 and a core select input 1817 for selecting which of the core 1-3 outputs 1811, 1812, or 1818 will be selected for input to buffer 607 and compare circuit 608.

During the testing of core 1, the IC of FIG. 18A is configured such that the inputs to core 1 are coupled to input pads 1803 and the outputs from core 1 are coupled to test circuits 1813 via connections 1811. Also test circuit 1813 is configured by the core select signals 1816 to connect the core 1 outputs to compare circuits 608. After the IC has been configured, core 1 is rendered testable using the present disclosure by inputting stimulus to core 1 via pads 1803 and inputting encoded response to test circuit 1813 via pads 1802 to compare against the outputs from core 1. The testing of core 1 is as previously described in FIGS. 6A and 6B.

During the testing of core 2, the IC of FIG. 18A is configured such that the inputs to core 2 are coupled to input pads 1803, via connection 1810 and connection circuit 1808, and the outputs from core 2 are coupled to test circuits 1813 via connections 1812. Also test circuit 1813 is configured by the core select signals 1816 to connect the core 2 outputs to compare circuits 608. After the IC has been configured, core 2 is rendered testable using the present disclosure by inputting stimulus to core 2 via pads 1803 and inputting encoded response to test circuit 1813 via pads 1802 to compare against the outputs from core 2. The testing of core 2 is as previously described in FIGS. 6A and 6B.

During the testing of core 3, the IC of FIG. 18A is configured such that the inputs to core 3 are coupled to input pads 1803, via connection 1810 and connection circuit 1809, and the outputs from core 3 are coupled to test circuits 1813 via connections 1818. Also test circuit 1813 is configured by the core select signals 1816 to connect the core 3 outputs to compare circuits 608. After the IC has been configured, core 3 is rendered testable using the present disclosure by inputting stimulus to core 3 via pads 1803 and inputting encoded response to test circuit 1813 via pads 1802 to compare against the outputs from core 3. The testing of core 3 is as previously described in FIGS. 6A and 6B.

The individual core 1-3 tests described above could be performed simultaneously on multiple ICs of FIG. 18A as described in regard FIG. 15, which would lower the cost to manufacture the ICs of FIG. 18A.

FIG. 19 illustrates a wafer 1901 that has been processed to include built-in connections for accessing common die input (S1) and common die output (R1) pads. The wafer comprises; (1) die 1-N each with input (S1) pads and output (R1) pads, (2) stimulus input grid lines 1904 connected to common die input pads, (3) encoded response input grid lines 1905 connected to common die output pads, (4) pad fuses 1906 connected in series between grid lines 1905 and pad connection lines 1907, 1908, 1909, and 1910, (5) tester probe contacts 1903 for connecting to stimulus grid lines 1904, and (6) tester probe contacts 1902 for connecting to encoded response grid lines 1905.

Tester 401 probes grid line contacts 1903, 1902 using a simplified external probe mechanism to input stimulus to the commonly connected die input pads and to input encoded response to the commonly connected die output pads. Testing occurs on the die as previously described. The difference between the test systems of FIG. 19 and FIG. 14 is that in FIG. 19 most of the common pad connections are provided on the wafer 1901, whereas in FIG. 14 most of the common pad connections are provided by the external probe mechanism 1401.

The fuses 1906 are included between grid lines 1905 and common pad connections 1907-1910 to provide for the case where a faulty die output cannot be disabled by the test enable signal 609. For example, if the tester 401 sets the test enable signal 609 high to enable testing using the present disclosure, and the output pad of die 3 remains enabled outputting a logic level, the fuse 1906 between gird line 1905 and the enabled output pad of die 3 will blow whenever the tester inputs an oppose logic level on grid line 1905. Without the fuse, the logic level maintained on the output pad of die 3 could prevent testing of the other die on wafer due to logic state contention on grid line 1905.

Alternatively, a resistive element could be substituted for each fuse 1906 to provide current limiting between a faulty die output pad and tester to enable testing of the other die. After testing and prior to the die singulation step, the pad connecting grid lines, probe contacts, and fuses/resistive elements can be polished off the wafer 1901.

If wafers were processed to include the embedded pad connection scheme shown on wafer 1901 of FIG. 19, tester 401 could probe multiple ones of the wafers 1901 at common probe contacts 1903 and 1902 to enable simultaneous testing of multiple wafers 1901. Being able to test multiple wafers simultaneously using one tester 401 would bring about further reductions in test time and cost of manufacturing die.

An example of the above described multiple wafer test approach would be where tester 401 makes contact to probe contacts 1903 and 1902 of multiple wafers 1901 via the previously described multiple wafer probe mechanism 1401 of FIG. 14. The major difference from FIG. 14 is that in FIG. 14 multiple die are tested whereas in this example, multiple wafers are tested.

While the present disclosure has been described thus far as being used to simultaneously test multiple die on wafer and, as mentioned in regard to FIG. 19, even multiple wafers, it can also be used to simultaneously test multiple packaged ICs as well.

FIG. 20 illustrates a test system according to the present disclosure for simultaneously testing multiple packaged ICs 1-N. The test system comprises a tester 401, a multiple IC probe mechanism 2001, and identical packaged ICs 1-N to be tested. In this example, ICs 1-N each comprise a die 601, a package 2002 for holding die 601, bond wires 2003 for connecting the output pads 603 of die 601 to package output leads 2004, and bond wires 2005 for connecting input pads 602 of die 601 to package input leads 2006.

The process of testing ICs 1-N in FIG. 20 is the same as that described in the testing of die 1-N in FIG. 14. The only difference between the two tests is that the packaged die 601 of FIG. 20 are connected to the IC probe mechanism 2001 via bond wires 2005 and 2003 and input and output package leads 2006 and 2004. It is assumed in FIG. 20 that each IC 1-N has package leads available for the test enable 609, scan control 612, scan input 611, scan output 615, compare strobe 613, and fail output 1302 signals. However, if not all the signals are available on package leads, they may be provided by sharing functional package leads or by generating the signals internal to the die using test interfaces such as the IEEE standard 1149.1 test access port interface.

FIG. 21 illustrates a tester 2100 capable of outputting busses 2103 and 2104 of mask (MSK) and expected data (EXP) signals, respectively. The tester 2100 of FIG. 21 is the same as the tester of FIG. 4 with the exception that the mask & expected encoding circuitry 407 in FIG. 4 has been replaced by the mask & expected driver circuitry 2102 in FIG. 21. Like the mask & expected encoding circuitry 407 of FIG. 4, the mask & expected driver circuitry 2102 of FIG. 21 receives MSK 410, EXP 409, and Enable (ENA) 408 inputs from memory 406. Unlike, the mask & expected encoding circuitry 407 of FIG. 4, the mask & expected driver circuitry 2102 outputs separate mask 2103 and expected data 2104 signals rather than encoding them into a single signal output 411, as did the mask & expected encoding circuitry 407. Thus the mask & expected driver circuitry 2102 outputs a first bus of mask signals 2103 and a second bus of expected data signals 2104.

FIG. 22A illustrates one example implementation 2201 of a mask driver 2202 and an expected driver 2203 that could exist within mask & expected driver circuitry 2104. The mask driver 2202 and expected data driver 2203 receive mask 410 and expected data 409 inputs from memory 406, respectively, and output mask 2103 and expected data 2104, respectively, to die/ICs to be tested. Also, the drivers 2202 and 2203 receive enable (ENA) 408 control from memory 406 for selectively enabling and disabling their outputs.

In FIG. 22B, the truth table depicts the operation of the mask and expected data driver implementation 2201 in response to ENA 408, EXP 409, and MSK 410 signal inputs. During the Compare Low operation, MSK is high and EXP is low. During the Compare High operation, MSK is high and EXP is high. During the Mask Compare operation, MSK is low and EXP is a don't care. As will be described later in regard to FIGS. 26A and 26B, the operations indicated by the states of the MSK 2103 and EXP 2104 outputs are performed by test circuits located on the die/IC.

FIG. 23 illustrates an arrangement 2300 of an output buffer 2307 connected between a core output 2310 and output pad 2312, and a test circuit 2301 connected between a core output 610 and output pad 2313. In this example, core output 610 is assumed to be connected, during test mode, to the output of a scan path in the die/IC. Also in this example, core output 2310 is an output that is not needed during scan test, so its pad 2312 can be used or shared for inputting mask data during scan test.

The test circuit 2301 is similar to the test circuit 606 of FIG. 6B in that it includes an output buffer 607, compare circuit 2314, and interface signals 609, 610, 611, 612, 613, and 615. The difference between test circuit 2301 and test circuit 606 is that the compare circuit 2314 of test circuit 2301 has separate inputs for receiving a mask signal 2303 and an expected data signal 2302, instead of a single input for receiving an encoded mask and expected data signal 614, as did the compare circuit 608 of test circuit 606.

When the die/IC containing the arrangement 2300 is placed in test mode, by the test enable 609 signal, the outputs of functional buffers 2307 and 607 are disabled and the compare circuit 2314 is enabled. A gating circuit 2308 (such as And gate 2309) is shown in the connection path between the test enable signal 609 and buffer 2307 to illustrate use and control of functionally required 3-state buffers 2307, similar to the use and control of functionally required 3-state buffers described in regard to FIG. 9B.

While in test mode, the tester 2100 of FIG. 21 can input mask 2103 and expected data 2104 signals (i.e. the response signals) to output pads 2312 and 2313, respectively. The mask 2103 signal is received by input 2303 of test circuit 2314 via connection 2305, and the expected data 2104 signal is received by input 2302 of test circuit 2314 via connection 2304. Simultaneously the tester inputs stimulus signals to other pads on the die/IC being tested. Since scan testing is being performed, the expected data signal input on pad 2313 will be compared against the scan path output response from the die/IC on core output signal 610, unless the compare operation is masked by the mask input on pad 2312.

Testing using the arrangement 2300 of FIG. 23 is much the same as that previously described using test circuit 606. The key distinction being that the test circuit 2301 has two inputs 2302, 2303 for receiving separate mask and expected data signals from two pads, as opposed to one input for receiving a single encoded mask and expected data signal from a one pad, as did test circuit 606.

FIG. 24 illustrates an arrangement 2400 whereby an input buffer 2402 and pad 2403, as opposed to an output buffer 2307 and pad 2312 in FIG. 23, are used to provide the mask input signal to test circuit 2301. As seen in FIG. 24, the mask data input to test circuit 2301 may selectively come from the connection 2408 between pad 2403 and buffer 2402, or from the connection 2401 between the buffer 2402 and die/IC core input. Further shown in FIG. 24 is an optional gating circuit 2405 (such as And gate 2407), that, under control of the test enable 609 signal via connection 2406, blocks the output of buffer 2402 from being input to the core of the die/IC during test. During test and with the exception that an input pad 2403 is used to input mask data instead of an output pad 2312, the operation of arrangement 2400 is the same as the operation of arrangement 2300.

Arrangement 2501 of FIG. 25A and arrangement 2502 in FIG. 25B are provided to simply illustrate that alternate mask and expected data pad connections to test circuits 2314 may be used if desired. Arrangement 2501 shows output pad 2312 and connection 2305 providing a path from the tester's expected data output 2104 to the expected data input 2302 of compare circuit 2314, while output pad 2313 and connection 2304 provides a path from the tester's mask data output 2103 to the mask data input 2303 of compare circuit 2314. Similarly, arrangement 2502 shows input pad 2403 and connection 2404 providing a path from the tester's expected data output 2104 to the expected data input 2302 of compare circuit 2314, while output pad 2313 and connection 2304 provides a path from the tester's mask data output 2103 to the mask data input 2303 of compare circuit 2314.

In general and during test mode, any available die/IC pad and connection may be used to provide mask and expected data input from the tester to the mask 2303 and expected data 2302 inputs of compare circuits 2314. Indeed, the pads used in supplying mask and expected data from the tester to the mask and expected data inputs of compare circuits 2314 do not even need to be pads coupled to the functional buffers 607 associated with the compare circuits 2314.

Further, it should be clear that compare circuits 2314, and others described herein such as compare circuit 608 of FIG. 6B, need not be coupled to functional output buffers as shown for example in FIGS. 6B and 24, but rather only need to be coupled to a signal on the die/IC, like core output signal 610, that provides a response output that can be compared against expected data input from a tester, or alternatively, masked from being compared by input from a tester.

FIG. 26A illustrates in more detail one-example implementation of compare circuit 2314. Compare circuit 2314 is similar to compare circuit 608 of FIG. 7A with the exception that trinary gate 701 of FIG. 7A is not required in compare circuit 2314. In compare circuit 2314, the EXP 705 and MSK 706 signals provided by trinary gate 701 of compare circuit 608 are provided by inputs 2302 and 2303 in compare circuit 2314.

The truth table in FIG. 26B depicts the operation of the compare circuit 2314. Contrasting the truth tables of FIG. 22B and FIG. 26B it is seen that the test operations previously described in regard to tester's mask & expected driver circuitry 2201 of FIG. 22A are realized by the compare circuit 2314 when a connection is formed between the tester's mask output 2103 and the compare circuit's mask input 2303, and between the tester's expected data output 2104 and the compare circuit's expected data input 2302. With the above mentioned exception, the operation of compare circuit 2314 is the same as the operation of compare circuit 608 of FIG. 7A.

In FIG. 26C, the pass/fail scan memory 704 is the same as in previously described FIG. 7C.

FIG. 27 illustrates the previously described test system of FIG. 15 adapted for use with the modified tester 2100 of FIG. 21 and the modified test circuit arrangements of FIGS. 23, 24, 25A, and 25B.

The test system of FIG. 27 is similar to the test system of FIG. 15 with the exception that the tester 2100 provides separate mask 2103 and expected data 2104 signal inputs to corresponding separate pad pairs 2701 and 2702 which are coupled to corresponding mask 2303 and expected data 2302 inputs of each test circuit 2703 (i.e. test circuits 2300, 2400, 2501, or 2502) within each die 1-N. Again, as mentioned in regard to FIG. 15, each common pad of die 1-N are connected together and driven by either a stimulus 414 input from tester 2100 or response 2104, 2103 inputs from tester 2100, to allow all die 1-N to be tested in parallel.

During scan testing, unlike functional testing, only a subset of common pads on die 1-N need to be connected together and accessed for input of stimulus and response from tester 2100. Therefore, each die has extra pads available for providing the two tester response inputs (i.e. mask and expected data inputs) to each test circuit 2703.

FIG. 28 illustrates in detail the parallel scan testing of die 1-N (2801-2803) of FIG. 27. When die 1-N are placed in the parallel scan test configuration, the data inputs of scan paths 1-N are connected to die inputs 1502-1504 and the data outputs of scan paths 1-N are connected to the inputs 610 of test circuits 2301. Tester 2100 inputs scan stimulus from bus 414 to die 1-N scan paths 1-N via the common die input connections 1502-1504 and 1609-1611, to allow all die 1-N to receive the same scan stimulus during test. Also, tester 2100 inputs from bus 414 to the scan input 611 of die 1 2801 via the probe mechanism.

Tester 2100 inputs mask data from tester bus 2103 to common die pad connections coupled to each test circuit's mask input 2303, and inputs expected data from tester bus 2104 to common die pad connections coupled to each test circuit's expected data input 2302, as indicated by connections 2808-2810. Any of the test circuit arrangements of FIGS. 23, 24, 25A, and 25B may be used and are indicated in FIG. 28 as test circuit arrangements 2805-2807.

Similar to the test previously described in regard to FIG. 17, the tester 2100 inputs scan stimulus and response to all die 1-N simultaneously. The test circuit arrangements 2805-2807 of each die operate to compare or mask the scan path outputs 610 of each die as determined by the mask 2103 and expected data 2104 input from the tester 2100. Tester 2100 inputs a combined fail output signal 1302 from die 1-N to response bus 110 via the fail output connection 1605. Also, tester 2100 inputs the scan output signal 615 from die N to the response bus 110.

Connection 1604 illustrates the daisy-chaining of the pass/fail scan output from die 1 to the pass/fail scan input of die 2, and so on to die N. At the end of the scan test, the tester 2100 shifts the pass/fail scan path of the serially connected die 1-N, from 611 to 615, to unload the pass/fail bits from each test circuit's pass/fail scan memory to determine which die passed or failed.

FIG. 29 is provided to simply illustrate that parallel testing of ICs 1-N 2901-2903 is possible as described above for parallel testing of die 1-N 2801-2803. In FIG. 29, the tester 2100 provides stimulus input to commonly connected IC pins 2901-2903 and response input to commonly connected mask IC pins and commonly connected expected data IC pins 2904-2906. The testing is the same as previously described for the die 1-N with the exception that the stimulus and response inputs pass through pins and bond wires to get to the die pads as shown in FIG. 20. As in the parallel die test of FIG. 28, the tester shifts out the pass/fail scan path within each serially connected IC 1-N after test to determine which IC passes or fails.

While FIGS. 28 and 29 illustrate the die and ICs as being serially connected together via connection 1604 and to a scan input and scan output of the tester, each die and IC could be individually connected to the tester via separate scan input and scan output pads/pins. Furthermore, the tester may connect to a subset of serially connected die and ICs using a separate scan input and scan output for each said subset of serially connected die and ICs. In either arrangement the purpose would remain to be the unloading of pass/fail information from the test circuits at the end of testing as previously described.

FIG. 30 is provided to illustrate how the test circuit arrangement 2300 of FIG. 23 could be modified to allow for the previously described testing of multiple embedded intellectual property cores 1805-1807 within a die/IC as shown in FIG. 18A. The modification involves the addition of multiplexer 1816 to the test circuit 2301 such that a selected core output 1811, 1812, 1818 may be coupled to the input 610 of test circuit 2301. As previously described, the selection action of multiplexer 1816 is controlled by a core select input 1817. While test circuit arrangement 2300 is shown in FIG. 30, it should be understood that any of the test circuit arrangements described herein, such as 2400, 2501, and 2502, could be similarly used with multiplexer 1816 to achieve the testing of embedded intellectual property cores.

The application may be practiced other than as specifically described.

What is claimed is:

1. An integrated circuit wafer comprising:
   (a) a first die having:
      i. die pads;
      ii. core circuitry coupled to the die pads;
      iii. a scan path in the core circuitry, the scan path having a scan path input coupled to a first die pad and a scan path output;
      iv. a test circuit having a scan path input coupled to the scan path output, an expected data input coupled to a second die pad, a mask data input coupled to a third die pad, a first serial scan path input, and a first serial scan path output;
   (b) a second die having:
      i. die pads;
      ii. core circuitry coupled to the die pads;
      iii. a scan path in the core circuitry, the scan path having a scan path input coupled to a first die pad and a scan path output;
      iv. a test circuit having a scan path input coupled to the scan path output, an expected data input coupled to a second die pad, a mask data input coupled to a third die pad, a second serial scan path input, and a second serial scan path output; and
   (c) first leads coupling the first die pads together, second leads coupling the second die pads together, and third leads coupling the third die pads together.

2. The integrated circuit wafer of claim 1 in which the first serial scan path output is coupled to the second serial scan path input.

3. The integrated circuit wafer of claim 1 including tester circuitry having leads coupled to the die pads of the first and second die.

* * * * *